(12) United States Patent
Lau et al.

(10) Patent No.: US 7,811,173 B2
(45) Date of Patent: Oct. 12, 2010

(54) INTERACTIVE CONTROL OF VIDEO MACHINES AND GAMES THEREFOR

(75) Inventors: Michael P. C. Lau, Kowloon (CN); Francis C. H. So, Kowloon (CN)

(73) Assignee: PC Concepts Limited, North Point (HK)

( * ) Notice: Subject to any disclaimer, the term of this patent is extended or adjusted under 35 U.S.C. 154(b) by 1019 days.

(21) Appl. No.: 10/674,062

(22) Filed: Sep. 30, 2003

(65) Prior Publication Data

US 2005/0070361 A1    Mar. 31, 2005

(51) Int. Cl.
- A63F 9/24 (2006.01)
- A63F 13/00 (2006.01)
- G06F 17/00 (2006.01)
- G06F 19/00 (2006.01)

(52) U.S. Cl. ............... 463/43; 463/38; 463/39
(58) Field of Classification Search ........... 463/38, 463/39, 43
See application file for complete search history.

(56) References Cited

U.S. PATENT DOCUMENTS

| | | | |
|---|---|---|---|
| 4,401,304 A * | 8/1983 | Hamano | 463/3 |
| 4,959,734 A | 9/1990 | Foster | 358/341 |
| 6,657,550 B1 * | 12/2003 | Flinn | 340/825.72 |
| 6,692,358 B2 * | 2/2004 | Lawrence et al. | 463/39 |
| 7,003,598 B2 * | 2/2006 | Kavanagh | 710/62 |
| 2004/0082361 A1 * | 4/2004 | Rajagopalan | 455/556.1 |
| 2004/0147270 A1 * | 7/2004 | Petrovich | 455/456.3 |
| 2005/0014563 A1 * | 1/2005 | Barri | 463/43 |
| 2005/0075166 A1 * | 4/2005 | Hemstreet et al. | 463/30 |
| 2005/0215324 A1 * | 9/2005 | Lippincott | 463/43 |
| 2005/0220439 A1 * | 10/2005 | Carton et al. | 386/4 |

FOREIGN PATENT DOCUMENTS

| | | | |
|---|---|---|---|
| GB | 2433211 A | * | 6/2007 |
| JP | 7-57035 | | 3/1995 |
| WO | WO01/93223 | | 12/2001 |

OTHER PUBLICATIONS

Linden deCarmo, DR. Dobb's Jour, Jul. 1998, various pgs., XP-000997146, Inside DVD.
Jim Taylor, DVD Demystified, Dec. 2000, various pgs., XP-002312564.
DVD FLLC: The Proceure for becoming a DVD Format/Logo Licensee, Jun. 2000, 4 pgs., XP-002313619.

* cited by examiner

Primary Examiner—John M Hotaling, II
Assistant Examiner—Adetokunbo Torimiro
(74) Attorney, Agent, or Firm—Jacobson Holman PLLC

(57) ABSTRACT

An apparatus and methods to provide a game system utilizing a normal household DVD player. The apparatus typically uses multiple remote controls and a game disc to provide an interactive game such as a quiz game. The game disc manipulates the address locations within the DVD to provide movement throughout the disc and the remote controls similarly at an offset to the address locations to source particular media files on the disc to be displayed on an associated television or similar device. The remote controls are also provided with a mechanism to avoid conflict between near simultaneous signals that include receivers within the remote controls to receive the signals, resolve the first remote control operated and only allow an operational code from that remote control to be received by the DVD player.

11 Claims, 21 Drawing Sheets

Diagram 801 - a basic digital code

Diagram 802 - Code pattern of code 802

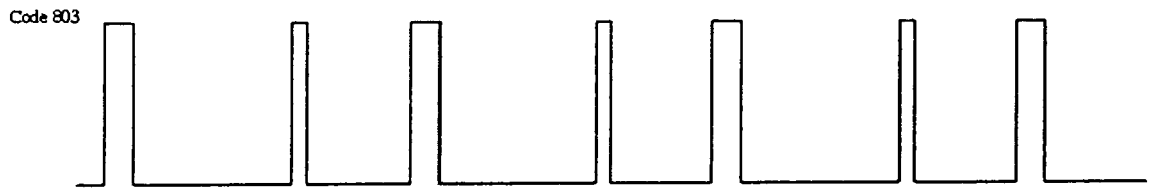
Diagram 803 - Code pattern of code 803
*Fig. 11*
Diagram 804 - combined signal of code 802 & code 803
*Fig. 12*

Diagram 901 - single silent key code

Diagram 902 - code signals a, b & c

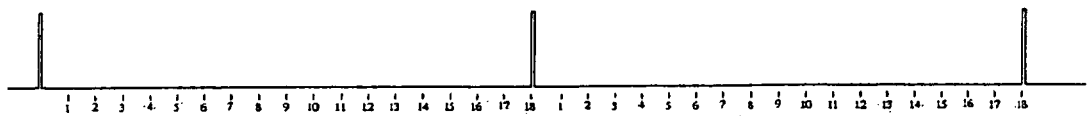
Code 9101
Code 9102
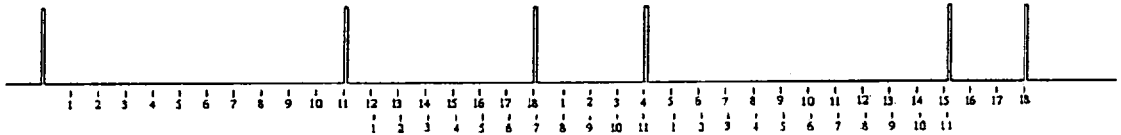
Combined signal of codes 9101 & 9102 as received by a receiver
Diagram 903 - single silent key codes
*Fig. 15*
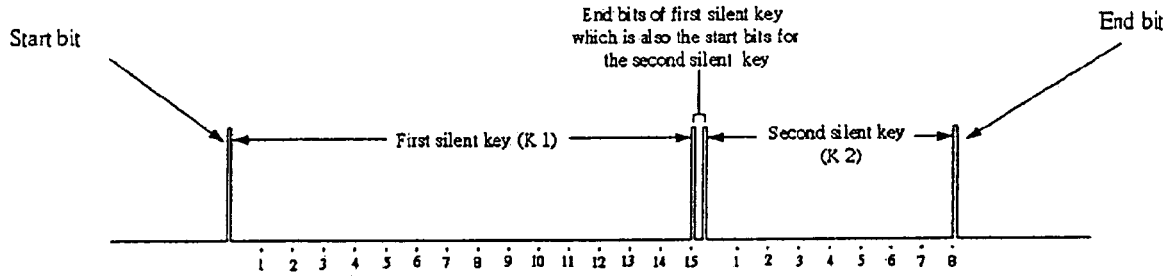
Diagram 904 - dual silent keys code
*Fig. 16*

Diagram 905 - Dual silent keys anti-clash coding method

Diagram 906 - dual silent keys code

Manchester code for button A
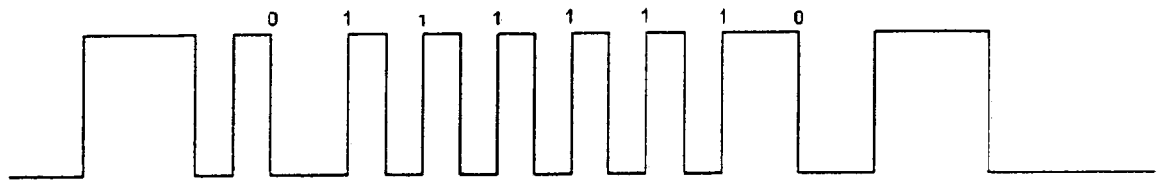
Manchester code for button B
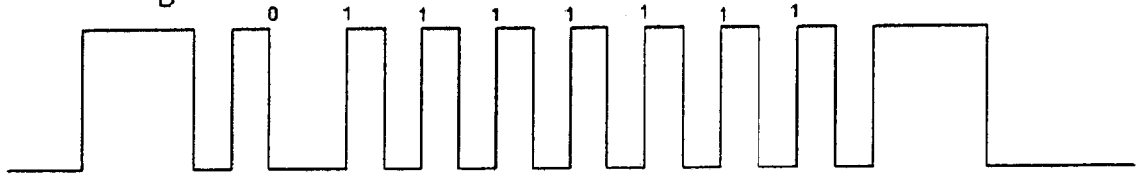
Manchester code for button C
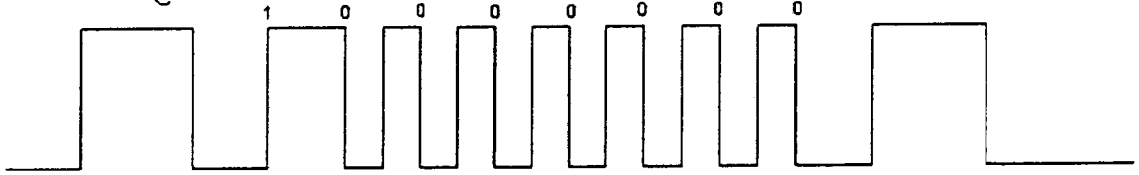
Manchester code for button D
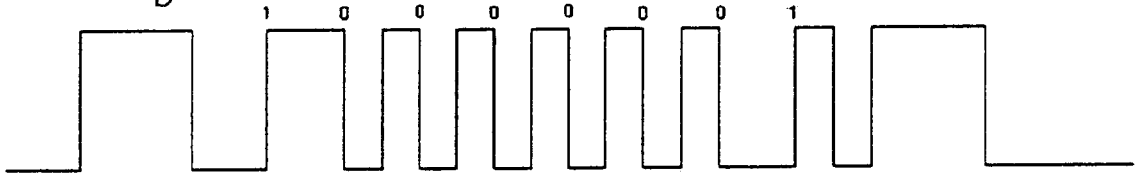
8 bits Manchester code for buttons A, B, C and D respectively
*Fig. 19*

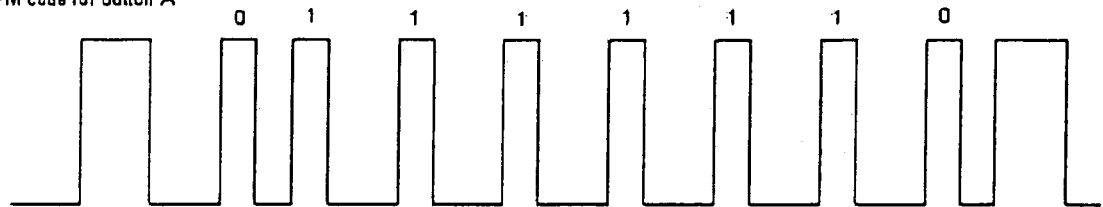
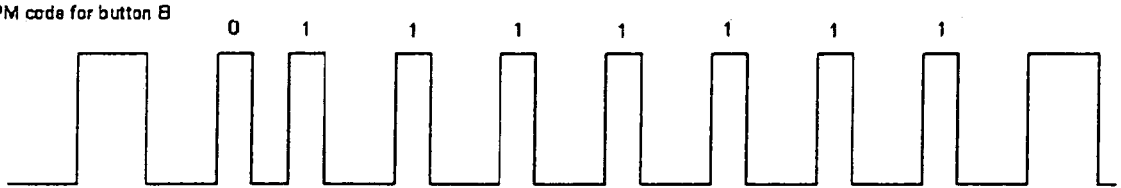
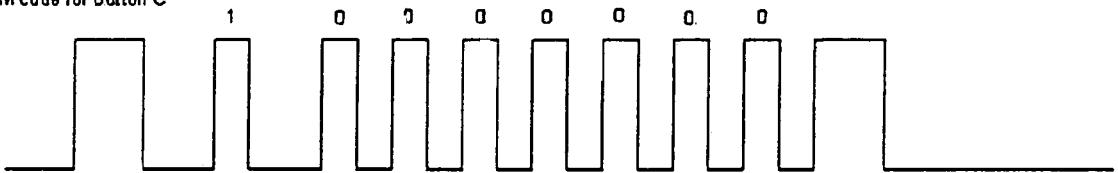
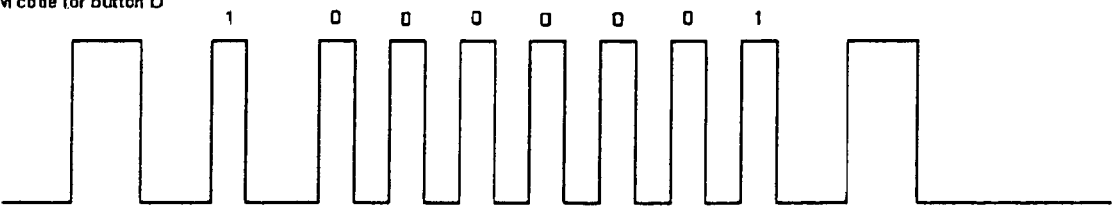
8 bits Pulse Position Modulation codes for buttons A, B, C and D
*Fig. 20*

INTERACTIVE CONTROL OF VIDEO MACHINES AND GAMES THEREFOR

FIELD OF THE INVENTION

This invention relates to a system for the interactive control of video machines such as digital video disc machines and games or entertainment systems to be used in and with such video machines.

BACKGROUND TO THE INVENTION

A variety of video machines exists in consumer households such as video cassette recorders, video compact discs players and digital video disc players.

When it comes to interactive game play, such machines are not utilized as their function is generally set up for the playing of movies or similar entertainment which requires simple continuous playing of the discs. The only interactive functions involve limited facilities to move through the media file by fast forward, rewind or similar.

When it comes to games, educational items or other more complicated interactive forms of entertainment, such devices are normally not utilized and instead specialized apparatus are used. Such specialized apparatus include personal computers, Sony Play Stations, X-Box or other similar apparatus. All such apparatus is specifically designed for more complicated interactive functions, multiplayer use and complex program game play. However, such machines are relatively expensive yet often contain a media player such as a disc drive that may often duplicate that in a household's existing DVD machine.

The difficulty with using a DVD machine or similar as a platform for a more complicated interactive form of entertainment such as a game is that the usual controls for a DVD machine such as fast forward, rewind, etc. are not functions that suit the operations of game in the use of the disc itself. It may prove very difficult to devise a game that can use such standard functions to provide an overall result.

A further difficulty in utilizing an existing DVD machine and an associated receiver such as a television set for a more complicated interactive game is that such standard apparatus are generally controlled by a single set of manual buttons on the device itself or, more frequently, by a single remote control. There is no accommodation of multiplayer control of a DVD machine. Even existing specialized game systems generally utilize direct cables between the control apparatus and the machine itself. Part of the reason for this is the difficulty an infrared system has in resolving near simultaneous transmission from multiple remote controls. A typical DVD machine upon receiving signals from two remote controls simultaneously will fail to resolve either until it eventually receives only a single signal. In anytime critical interactive game such a system will not reflect the first data transmission received but instead, merely the first non-conflicted data transmission.

The variety of problems has restricted the use of existing video machines such as DVD machines in providing anything other than entertainment in the standard method of movies or similar.

OBJECT OF THE INVENTION

It is an object of the present invention to provide interactive control of video machines and games therefor that overcome some of the disadvantages of the prior art and allow utilization of existing video machines such as DVD machines in a more interactive entertainment system. As a minimum, it is an object of the present invention to provide methods and apparatus for such interactive control and games for such video machines so as to provide the public with a useful choice.

SUMMARY OF THE INVENTION

Accordingly, in a first aspect, the invention may broadly be said to consist in a game or entertainment apparatus for use in conjunction with a media file reader and display comprising:
 a media containing apparatus containing a media file having programming instructions to control movement of the media reader through the media file upon receipt of instructions from a controller; and
 wherein said media file directs and programs the media file reader to alternative memory locations in the media file to display screen images to construct an interactive game and controls the responses of the media file reader to the signals from the controller.

Accordingly, in a second aspect, the invention may broadly be said to consist a game apparatus for use with a media file reading and display apparatus operable by wireless signals through a wireless signal receiver including:
 at least two wireless signal transmitter units for producing wireless signals in response to user inputs; and
 means to compare receipt of near simultaneous wireless signals so as to determine the first such signal received and allow only an operational code from the first such signal to be processed by the wireless signal receiver of the media file reading and display apparatus.

Accordingly, in a yet further aspect, the invention may broadly be said to consist in a method of providing interactive multiplayer game play or entertainment with remote controls comprising the steps of:
 utilizing an initial signal from said remote controls to determine the first control operated upon near simultaneous operation of said remote controls; and
 utilizing a subsequent signal transmission from only the remote control selected as the first transmitter to perform subsequent operation in the game play or entertainment system.

Accordingly, in a yet further aspect, the invention may broadly be said to consist in a programmed digital video disc for use with interactive games on a DVD player including:
 a plurality of video files at specified locations; and
 wherein the file also contains instructions to alter the address location memorised in the DVD player such that the sequential determination of the subsequent address location that the DVD player moves to may be other than the subsequent physical address location on the disc.

Accordingly, in a yet further aspect, the invention may broadly be said to consist in an interactive game system for use with a DVD player including the following:
 a disc programmed containing a plurality of video files and address instructions to alter the address location the DVD player holds in memory so as to alter the next sequential address location to which the DVD player would normally address.
 at least one remote control having a plurality of outputs to further alter the address location to which the DVD player may subsequently play.

Further aspects of this invention will become apparent to that skill in the art upon reading the detailed description which should be considered in all its novel aspects.

BRIEF DESCRIPTION OF THE DRAWINGS

Preferred embodiments of this invention will be described with reference to the following drawings in which:

FIGS. 10 and 11 show alternative code patterns that may be transmitted by remote controls;

FIG. 12 shows a combined received signal of the signals of FIGS. 10 and 11;

FIG. 15 shows combined received signals from those shown in FIG. 14;

FIG. 16 shows a transmission sequence in accordance with an embodiment of the invention;

FIGS. 19 and 20 show the Manchester codes and 8 bit Pulse Position Modulation Codes respectively for transmissions in accordance with a data console in a preferred embodiment of the invention;

DETAILED DESCRIPTION OF PREFERRED EMBODIMENTS

A preferred embodiment of this invention will now be described. The invention in one preferred embodiment may comprise a game and associated apparatus for use in a system containing an existing commercial video machine such as a digital video disc machine. Please note that although reference may be made to DVD machines, this would equally apply to other digital disc machine such as video compact discs and similar apparatus.

In referring to the game itself, reference will be made to a quiz game. This will form a particular preferred embodiment provided as an example of the facilities of the system and apparatus and the manner in which such games may be programmed. Nevertheless, a variety of other games may be designed and envisaged keeping in mind the constraints on the types of controls available and the non-specialized construction of the DVD machine itself. Generally, games in which the video machine may show segments of a media file and then decisions are prompted by the program itself would be most suited to the apparatus subsequently described.

Figure 1:
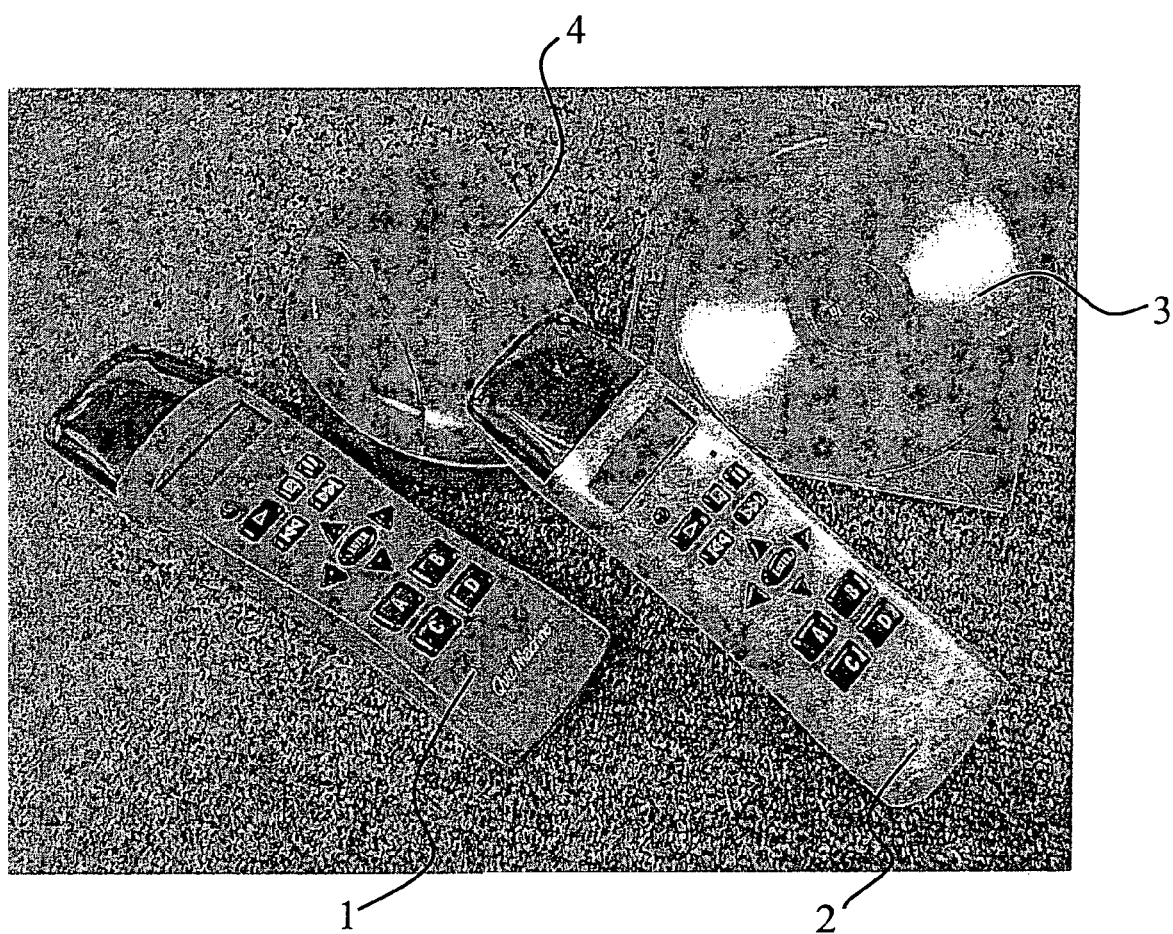
FIG. 1 shows a perspective view of game apparatus elements for use in a preferred embodiment of the invention.

Referring firstly to FIG. 1, the basic apparatus for the game in at least a preferred form as shown. This involves at least one, or in this case, two control means for the game in the form of, preferably, remote controls 1 and 2 together with a media file 3 containing the game itself.

In this particular preferred embodiment, an additional transmitter in the form of a data console 4 is included for communication with the remote controls 1 and 2 that act as both transmitters and receivers. The full operation and use of these components is described subsequently.

It will be appreciated that the apparatus in FIG. 1 does not show a video machine such as a DVD machine. The apparatus in FIG. 1 is intended to be utilized with such existing apparatus as a household may already possess.

In its simplest form, the invention may comprise a media file 3 for use in a DVD player or similar. The media file may contain a series of screen displays and/or media file segments as well as menus. It is the intention of the media file to provide the user with some decision-making capability that may be transmitted to the DVD player through a remote control 1. In doing so, the media file 3 provides an interactive game in which the user makes various choices or selections with the control means 1 so as to provide a more interactive form of entertainment than simply watching a typical movie or similar on DVD.

Figure 2:
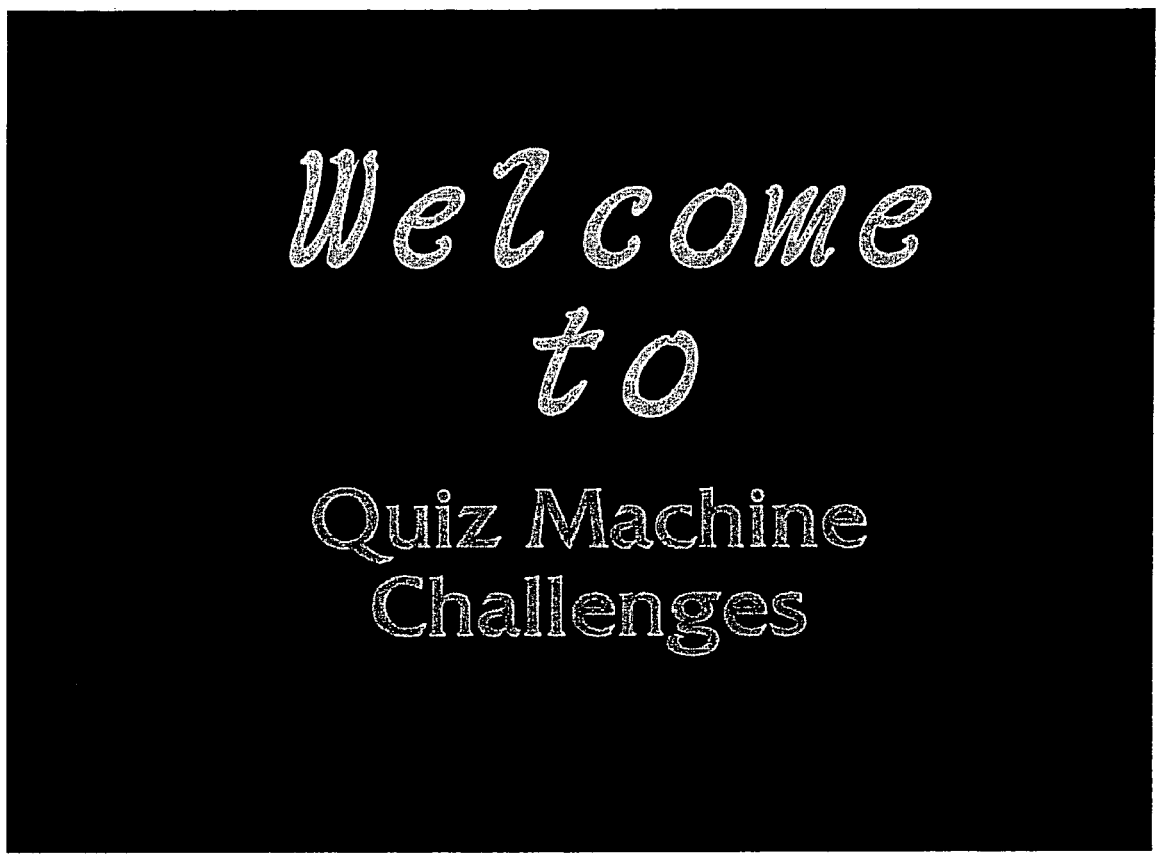
FIGS. 2 to 4 show screen displays for use in conjunction with a preferred embodiment of the invention.
Figure 3:
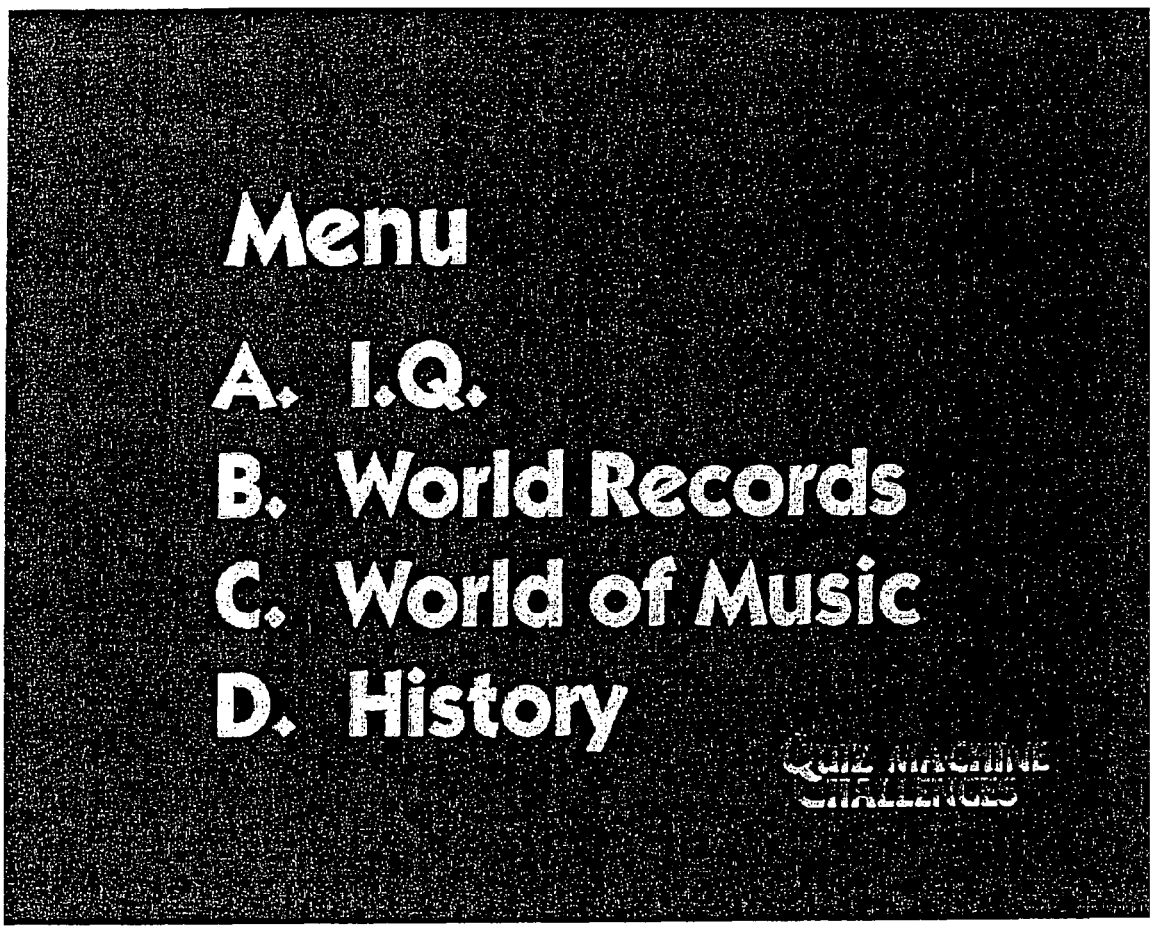
Figure 4:
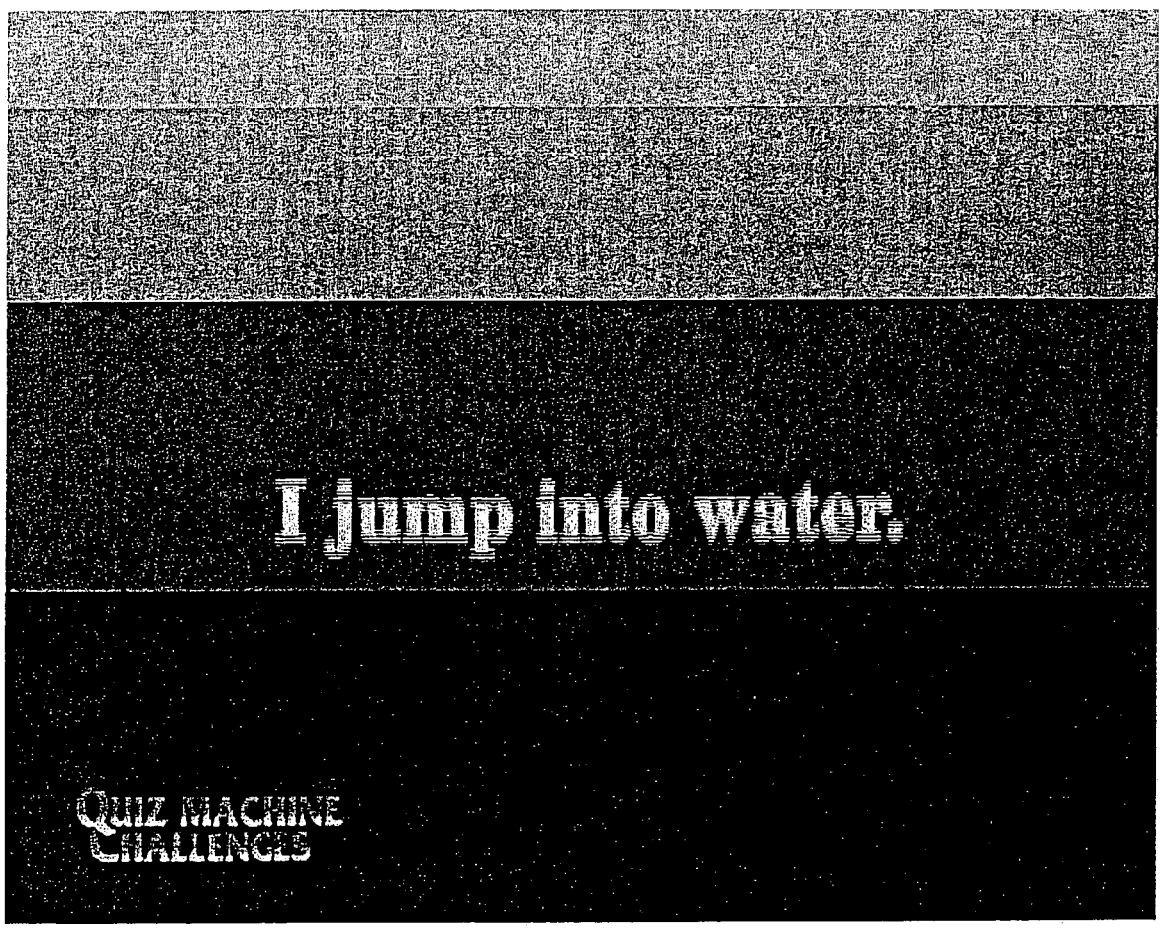

An example of such an interactive game that may be provided on a media file 3 is a quiz game. The game may involve an introduction as shown by a typical screen display in FIG. 2 and be followed by various menus, an example of such a menu being shown in FIG. 3. A particular question may be presented as is shown by a typical screen display in FIG. 4 and options given for possible answers. Upon selection of an answer, a media file may display a result on the screen and return to the menu selection.

In the use of the media file, the DVD player can provide the initial introduction and needs to be paused by control from the media file itself at each of the menu selections. For example, at the menu selection shown in FIG. 3, a user needs to choose the particular categories of questions they wish to face. The media file then needs to direct the drive of the DVD player in response to the user's selection to the particular category of questions and proceed with presentation of, for example, a random question within that section. The media file may progress through various contents such as a short video display or simply just display a question. The media file and game 3 must then await input from the user through a remote control 1 to the normal DVD remote control receiver and can then display a suitable result.

With the DVD player having limited program ability itself, it is over to the media file 3 itself to direct the DVD player through the various steps required to provide an interactive form of entertainment. Typically, this would involve commands to the DVD player to move to alternative memory locations throughout the media file so as to return to menus, display content and generally respond to the interactive choices made by a user through the remote control.

In a more preferred version of the invention, a specific remote control 1 as shown in FIG. 1 is utilized. Such a remote control may already be provided with suitable buttons or controls to make the various selections. In this preferred form, the remote control sends signals in response to a user selecting these buttons that is not one of the standard signal kinds recognized by the DVD player from an ordinary household remote control. Preferably, the signals will be provided in a digital code different from typical codes so as to still allow availability of the typical signals without confusion on the remote control. It will be noted that the remote control 1 does include the normal buttons in the form of play, stop, pause, rewind and fast forward as well as arrow keys for menu selection and the choice buttons A, B, C and D in a user interface.

DVD players sold commercially typically provide alternative coded signals on which more select commands can be provided. Typically these coded signals are used by manufacturers in testing and programming DVD players. If desired, the extra functions on the remote control 1 in the form of the buttons A-D similar may utilize these coded signals. The control functions of a DVD player are basically address driven.

Figure 5:
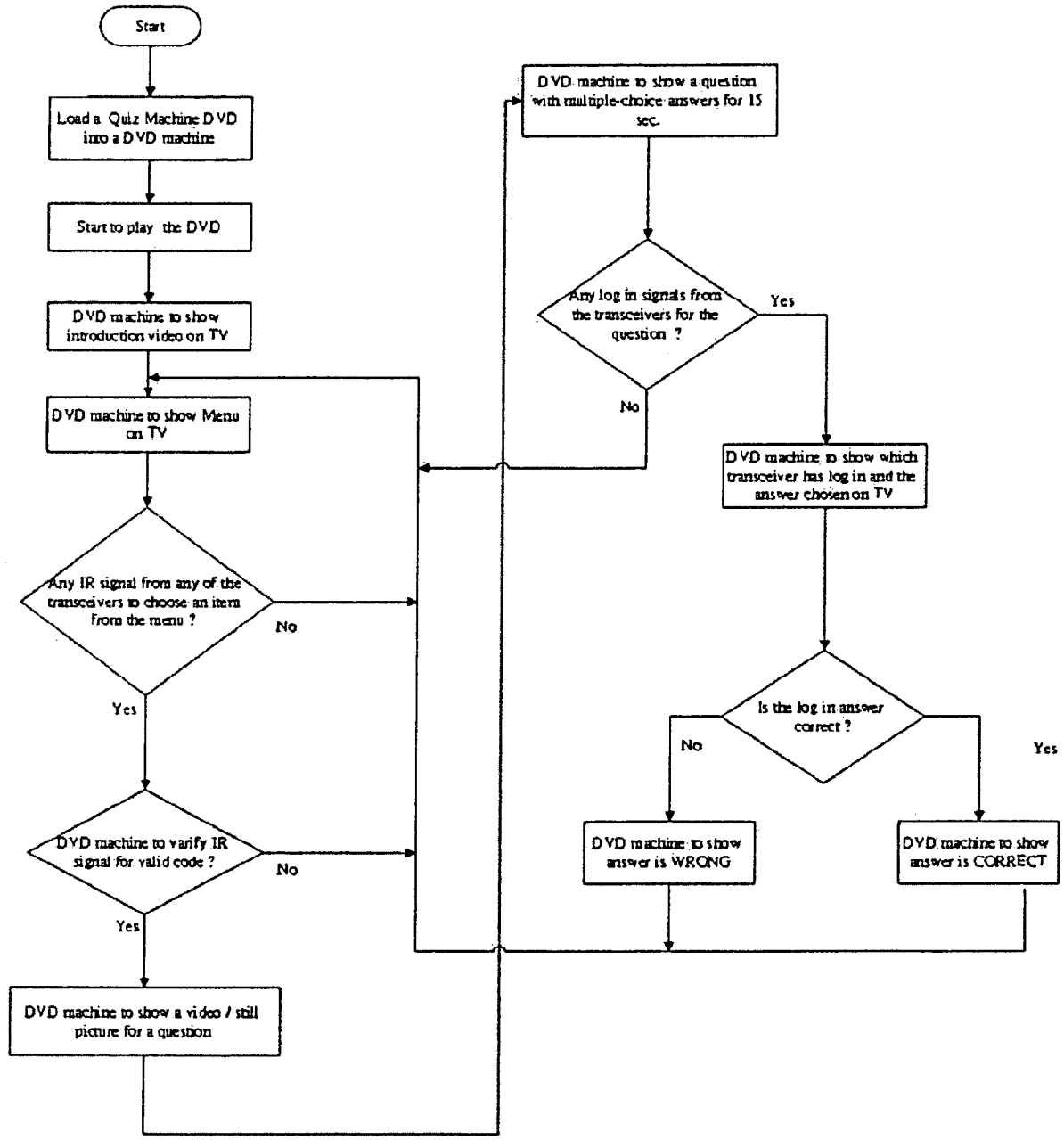
FIG. 5 shows a flowchart of operations of a preferred game in accordance with the invention.

The operations of a preferred embodiment of the invention in the form of a quiz game be played on a DVD machine is shown in FIG. 5. This shows the basic operations of the game as determined by the media file.

At the outset, the disc 3 is loaded into a DVD machine and operations commence through the use of the "Play" button on the remote control or programmed to play automatically upon loading. The DVD machine may show the introduction video on the associated monitor just as it would in the normal play operation of any DVD. This may progress as far as the presentation of a menu on the display.

If no signal is received from any of the infrared transmitters in the form of remote controls, the game may simply pause with the menu on display. However, if such a signal is received, the DVD machine may proceed to verify the infrared signal as being a valid code and, if not a valid code, may again return to the menu selection awaiting a valid code. Once a valid code has been received, the display may show a video, still picture or other form of content to present a question to a user.

As shown in the flowchart in FIG. 5, the DVD machine may continue to show the question and present suitable multiple choice answers for a suitable time period such as, 15 seconds. If no signal is received from the transmitter remote controls, the operation may return to the menu selection. If such an answer has been received, the game may determine which remote control was the first to send the signal and whether or not the answer is correct, display the result and also return to menu selection.

It is to be noted that, even in this basic form, it is possible to use multiple remote controls to send answers and, in such a situation, the apparatus may also determine which of the remote controls provided the answer for a multiplayer function. This may be determined by different codes used for different remote controls for multiplayer use. A DVD machine does not have the ability to determine which remote controls provided the answer for a multiplayer function by itself. The different codes used by different remotes simply direct the DVD to display the predetermined contents for the codes to give the effect that a DVD machine has determined which of the remote controls provided the answer.

It will be appreciated that the use of the game in multiplayer mode may also increase the complexity and challenges on the system technologies. In this instance, the remote controls 1 and 2 as shown in FIG. 1 and the overall system apparatus may include additional features to resolve conflicts should simultaneous signals be provided from two different remote controls. A normal infrared receiver in a DVD machine cannot resolve conflicting signals of this type. Therefore, if remote controls and the system components overall are not provided with some additional modification or features, players utilizing different remote controls may both try and answer the question at almost identical times. With the signals from the remote controls conflicting and confusing the infrared receiver in the DVD machine, the machine is unlikely to respond to either users requests and instead will assume that no signal has been received until it receives a complete signal from any single remote control. The more players involved in the game and hence the more remote controls being used, the greater the difficulty in resolving and determining the user to first attempt the answer and it may be the third or fourth remote control utilized that may in fact be the first non-conflicted signal received and a player may be awarded a result to which they are not entitled.

It will be noted that although this problem is presented in terms of the quiz machine, any multiplayer interactive form of the game if decisions need to be made quickly and the first player to select an option dominates requires some method by which to resolve this possibility of near simultaneous signals.

To deal with near simultaneous transmission of signals from the remote controls, the present invention seeks to provide a mechanism to resolve the conflict such that the first signal sent is the only signal operated upon by the DVD machine. This may be performed by intercepting the signals by specialized apparatus and sending a correct signal to the DVD machine once the conflict is resolved. However, this is not the preferred method.

To avoid the case where the signals are received close together, the present invention seeks to resolve which signal is the first signal sent quickly enough to then block subsequent operation signals being sent and allow clear passage of the correct signal. In simplest terms, this can involve the provision of a receiver that can provide the resolution and then instruct all but the correct remote from transmitting signals until the correct signal is received. Again, this could be provided by separate apparatus but would still require some form of receiver in the remotes to receive the transmission to stop subsequent transmission.

To minimise costs and the number of items used in the system, the present invention has made each remote control both a transmitter and a receiver of such signals. Resolution of the first signal is performed in the remotes themselves, such that each remote receives the transmissions from the remotes, determines whether its own or another remote was the first signal sent and if not the first itself, will cancel transmission for long enough for the first remote to have completed its signal transmission.

In providing such a system, it is possible for the remotes to transmit sufficiently closely in time for transmission of more than one remote to have started before receipt and resolution of which was first has been completed. This can cause the signal from the first remote to be corrupted before it has had a chance to halt transmission of the others. Hence, the game may still not receive a correct first transmission.

In a yet further improvement, the present invention utilises two code portions. The first is a portion to determine which of the transmitters has been activated first, and the second is the operation code which is sent after the first code conflict has been resolved and hence is sent only by the correct transmitter. In this fashion, the DVD machine will only receive one operational code.

A further advantage of using two code portions is that all remotes can receive the first portion of the code such that the remote cannot only resolve who was first but also who was second, third, etc. The remotes can ensure only the first operated control sends the operational portion of code.

A further difficulty arises in the case of genuinely simultaneous transmission whereby the system cannot resolve the first sent. This would only occur in very rare instances whereby the signals are so closely aligned as to prohibit resolution. In this case, a variety of actions may be taken.

In one instance, the system may award a tie and replay that portion of the game or media. In another possibility, the system may provide some preferential treatment to one remote over another by pre-assigned characteristics. Although this can potentially bias a game in favour of one remote, the instance whereby the signals are so close would be so rare as to make the difference to game play insignificant.

The present invention utilises the second option whereby one remote is favoured over others, at least in terms of simultaneous transmission of the same button. Each transmission is different for each key on the remote so it is possible to provide this minimal bias to button A in one remote, button B in another, etc. This should even out any slight discrepancies.

To improve interactive game play from the DVD machine, a further component may be provided in an optional system being a further transmitter or data console 4 as shown in FIG. 1. In a game such as the quiz game described herein, that may be a console that can keep track of scores and then either display these itself or transmit the result for display on the remotes. It will be appreciated that the remotes can be fitted with a screen display of some sort for this purpose and already have receivers built in to deal with the simultaneous transmission problem.

Preferably the transmission from the console to the remotes is by Infrared. It can also be radio frequency transmission from the console to the remotes and between the remotes.

Of course, to keep track of scoring or other interactive functions that such a console may want to utilise, the console must be in communication with the DVD player. In the present invention, this is performed by connecting the console to an audio output of the DVD machine. It will be appreciated that DVD machines generally have multiple audio outputs and other outputs that could be utilised to allow connection of such a console. The use of the audio output in the preferred example allows the game disc to communicate with the console through the encoding of codes in the audio track of the DVD that can be interpreted by the console. For example, upon a correct answer being given in the quiz, the disc may have a code in the audio track that signals the console to award a point. Either the game, the console or even the remotes can contain means to determine which of the remote controls is awarded the point as the resolution as to which gave the answer has already been determined and is known to the game, the console should it be given this information by the game and by the remotes. Preferably, the audio and video outputs of the DVD may be routed through the game console and to the monitor or TV so that the game can communicate with the console in any manner it desires that does not otherwise interfere with the screen display. In normal playing of, for example, a movie DVD, the console allows direct passage of information to the TV and simply remains idle.

Figure 6:
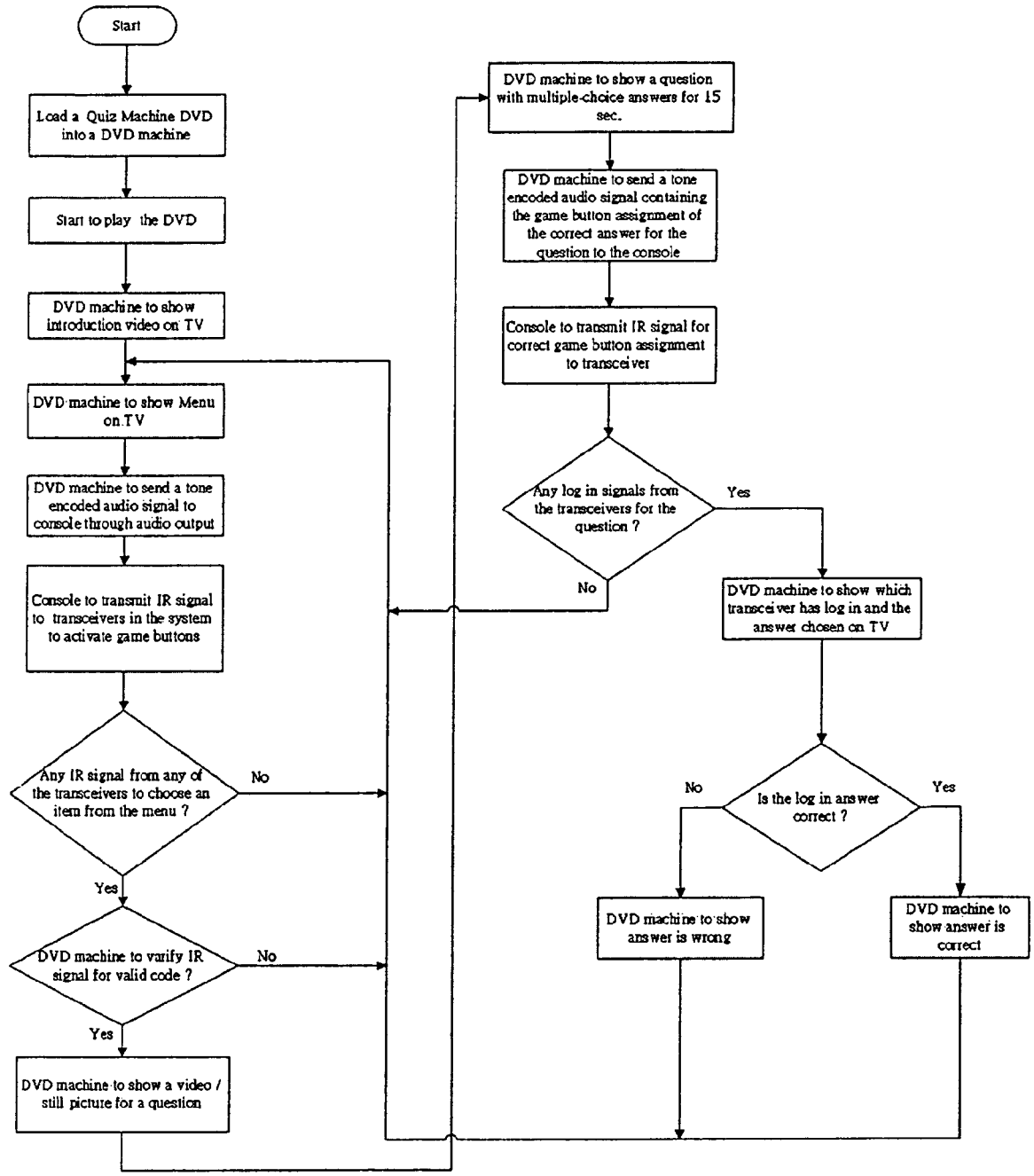
FIG. 6 shows a flowchart of a more complex game operation from that shown in FIG. 5.

In a specific example of the invention, the operation of the game with the anti-clash system to resolve simultaneous signals and the use of the date console is shown in FIG. 6. It will be noted the flow chart includes transmission of signals on the audio output of the DVD to provide information to the console.

Figure 7:
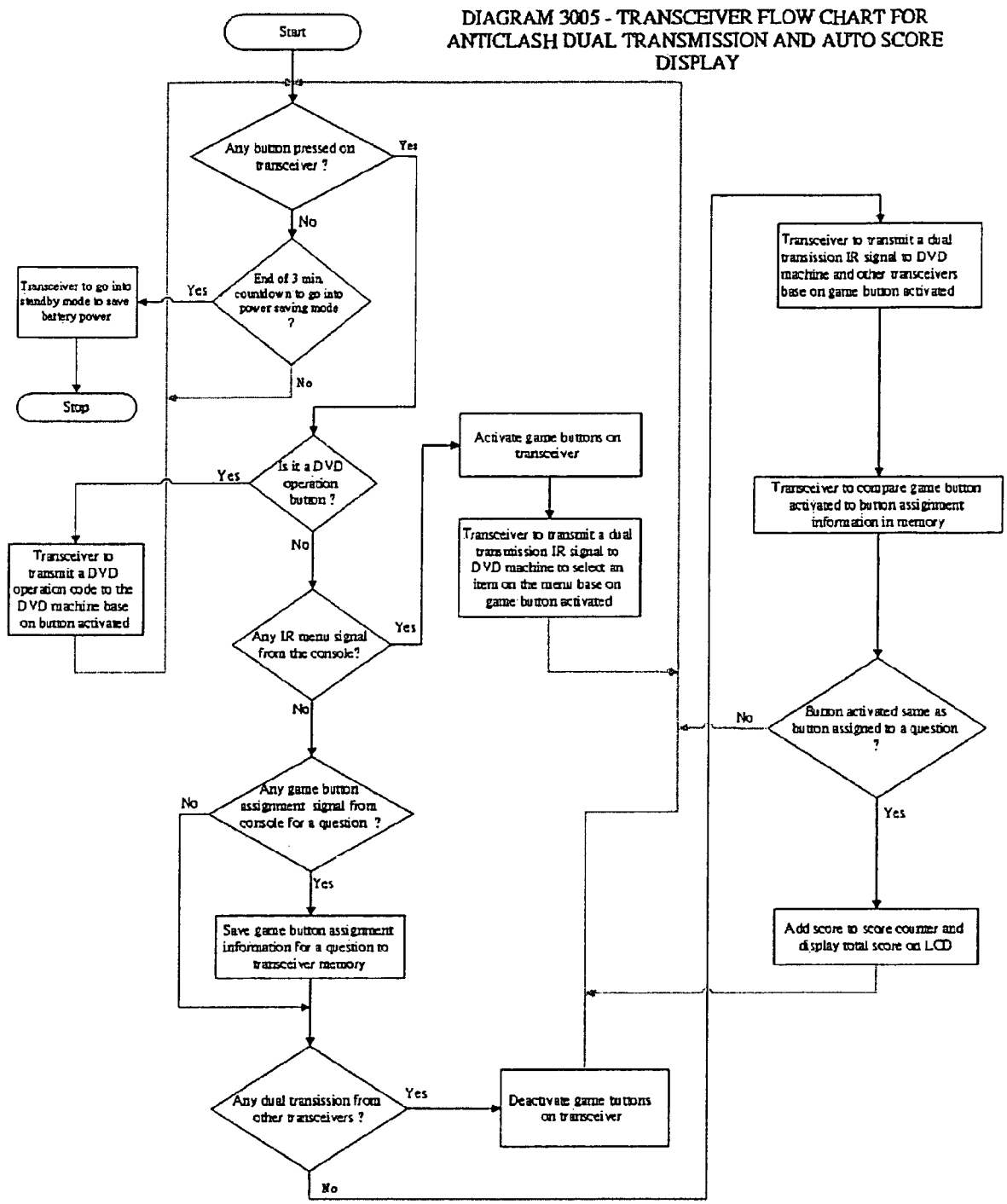
FIG. 7 shows a flowchart of operations of a transceiver in accordance with a preferred embodiment of the invention.

FIG. 7 shows the operations of a remote control in accordance with a preferred form of this invention. It can be seen that the game buttons are deactivated upon receipt of dual transmission from other receivers.

A method of coding the buttons in game play within the remotes and of resolving the clash of simultaneous signals will now be described. This is a preferred version although it will be appreciated that a variety of other codes and comparison methods may be used if desired without departing from the generality of the method.

The following is to explain the protocol. As explained previously, this invention employs a dual transmission that includes a first transmission of an anti-clash protocol called game code and a second transmission of a different protocol called operation code. The anti-clash game code is for communications between the hand-held transceivers such as remote controls and to interact with the game play, while the operation code is for operating a DVD machine.

A majority of remote control systems are capable of multiple control functions, for example, a remote control system for a TV set. In order to carry out such a multiple controls using a single transmitter, each function in the system is assigned with a unique digital code. When a button on a transmitter is activated, an infrared signal containing a specific code is transmitted. The infrared receiver in the TV set receives and decodes this infrared signal and then carries out the required function.

Figure 9:
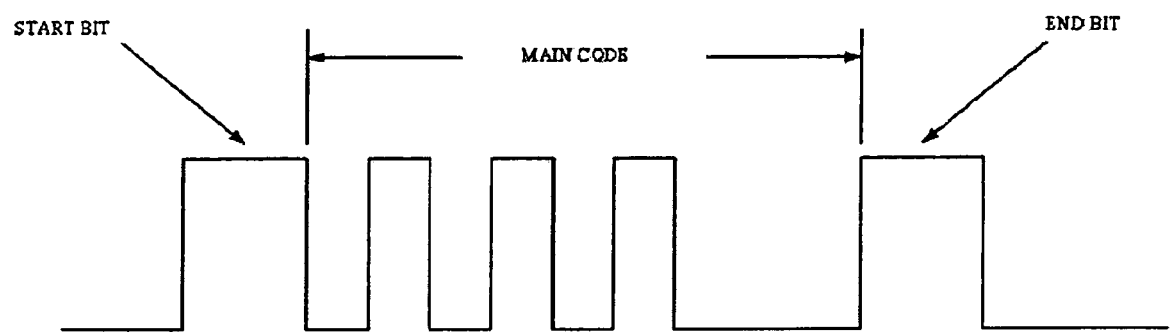
FIG. 9 shows a basic digital code transmission of a remote control transmitter.
Figure 10:
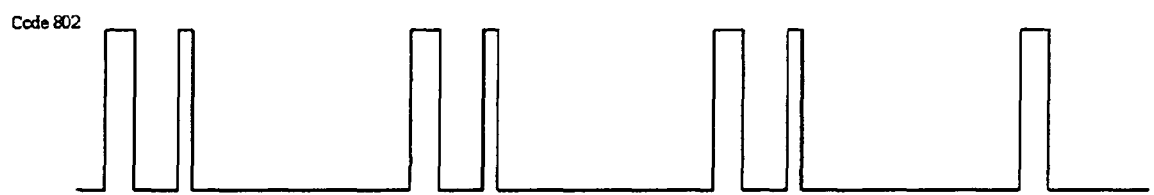

A digital code basically consists of a series of pulses. FIG. 9 shows a simple digital code. It consists of a starting bit, the main code and an ending bit, which when viewed together, form a code pattern. For example, assume a simple infrared remote control system which consists of a single receiver and two hand-held transmitters, wherein each has a single control button. When the button of transmitter A is activated, a code pattern 802 as shown in diagram FIG. 10 is generated and transmitted. When the button of transmitter B is activated, a code pattern 803 as shown in FIG. 11 is generated and transmitted. If the two transmitters are operated randomly and simultaneously, chances are the two signals may be transmitted at about the same time, resulting in interference or a clash situation as shown in FIG. 12. Under such a condition the receiver would be unable to resolve and decode the individual signals because the clashed signals no longer retain the individual identity of the original signals. In other word the signals are distorted.

Figure 13:
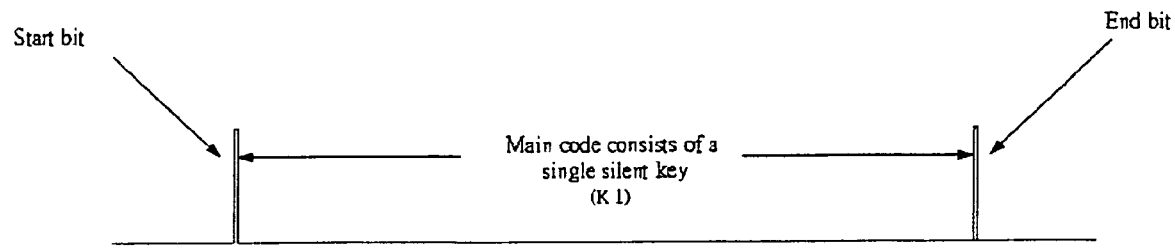
FIG. 13 shows a single silent key code transmission.

The present invention employs a coding method, in which a game code, namely a Key, is formed using the silent period as shown in FIG. 13. The code consists of a starting bit, a code pattern comprising a silent period K1 in a unique time length and an ending bit. The time length of a Key is derived from Set Theory, such that in the event of a clash situation all the codes retain their own individual identity and therefore can still be successfully decoded.

Figure 14:
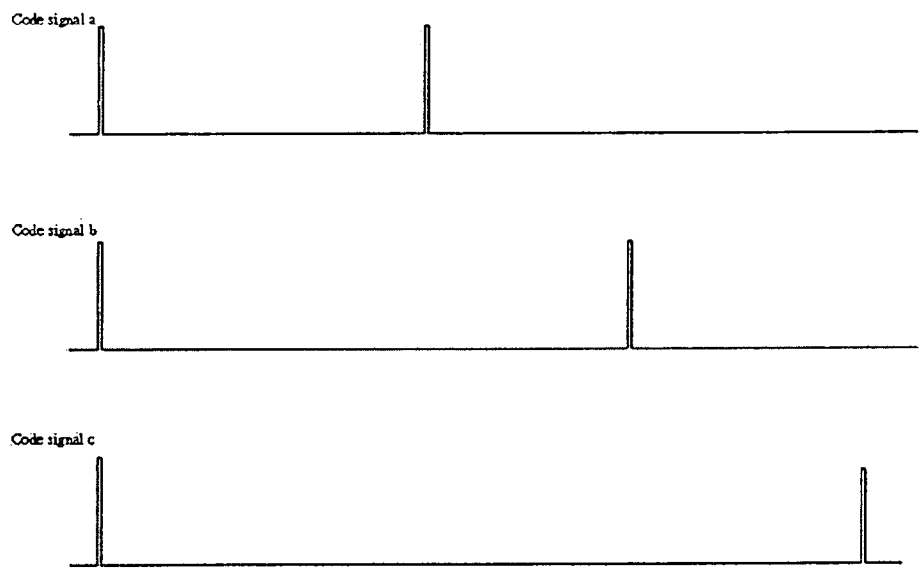
FIG. 14 shows alternative silent key code signals.

For example, assume a system consisting of 3 individual transmitters, each of which transmits a unique single key code a, b, c respectively, as shown in FIG. 14

Let a be an element (i.e. a code signal) from transmitter 1.
Let b be an element from transmitter 2.
Let c be an element from transmitter 3.
Let A be the set so that for any element a from transmitter 1, there is a number n such that the signal created by repeating a n times would be an element in A.
That is, $A=\{\forall a, \exists n \text{ such that } n \cdot a \in A\}$, where $n \cdot a$ is obtained by repeating the element a n times.
Let B be the set so that for any element b from transmitter 2, there is a number n such that the signal created by repeating b n times would be an element in B.
That is, $B=\{\forall b, \exists n \text{ such that } n \cdot b \in B\}$, where $n \cdot b$ is obtained by repeating the element b n times.
Let C be the set so that for any element c from transmitter 3, there is a number n such that the signal created by repeating c n times would be an element in C.
That is, $C=\{\forall c, \exists n \text{ such that } n \cdot c \in C\}$, where $n \cdot c$ is obtained by repeating the element c n times.

In order to avoid a clash when two or more signals are sent simultaneously, we have to meet the condition:

$\forall a, b, c, \ldots$ where $a \in A, b \in B, c \in C \ldots$ such that $A \cap B \cap C \ldots = \Phi$.

In order for $A \cap B \cap C \ldots = \Phi$, we have to have the following:

$\forall n, m, 1, \ldots \in N, a \in A, b \in B, c \in C, \ldots$ Where $N=\{1, 2, 3, 4, \ldots\}$.

$n \cdot a \cap m \cdot b \cap 1 \cdot c \ldots = \Phi$.

We have the above condition to ensure that each code signal is unique.

i.e. $\forall a \in A$, a not $\in B$ and a not $\in C$ $\forall b \in B$, b not $\in A$ and b not $\in C$ $\forall c \in C$, c not $\in A$ and c not $\in B$ FIG. 15 shows an example of 2 codes generated based on this single key principle. A close examination of these two codes reveal that since code 9102 has a longer code length than code 9101, if code 9102 is transmitted first and a moment later followed by code 9101 and if incidentally the time difference between the two transmission equals to one code length of the shorter code 9101 as shown in FIG. 15, a receiver/decoder in the system will mistakenly interpret code 9101 as the first valid code that it receives, resulting in an error.

To eliminate such an adverse effect, this invention introduces a second silent period, namely a second key to a code. Such that a code now consists of a starting bit, a silent period key1, an ending bit for key1, which is also the starting bit for the second silent period, a second silent period key 2 and an ending bit. An example of this dual key code is as shows in FIG. 16. The time period for both keys conforms to Set Theory.

Figure 17:
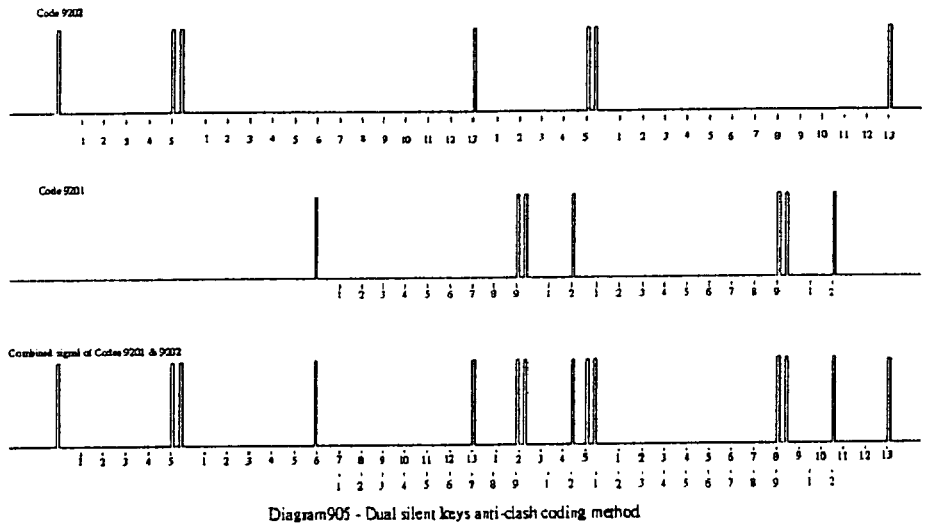
FIG. 17 shows a yet further combination of signals in accordance with an aspect of the invention as shown in FIG. 16.
Figure 18:
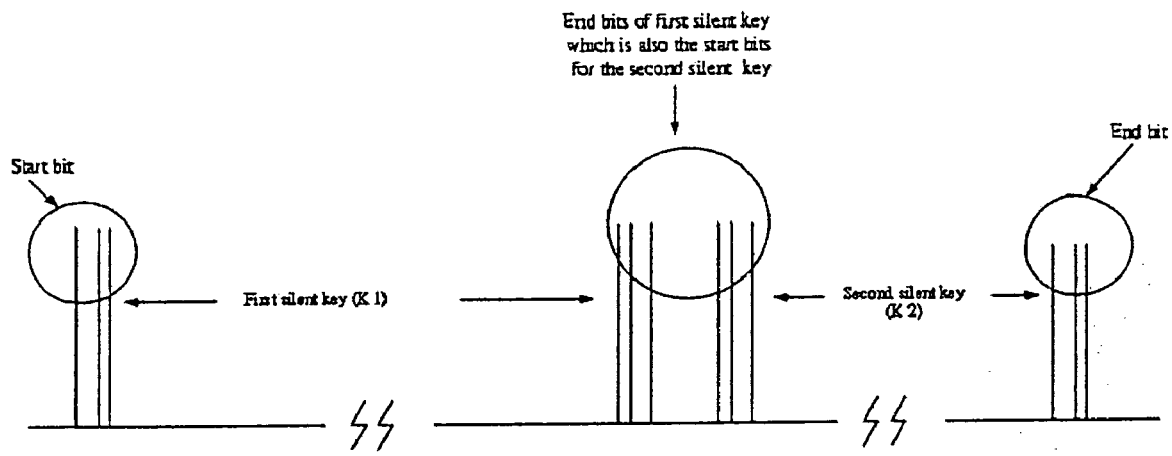
FIG. 18 shows a dual silent keys code in accordance with a portion of a preferred form of the invention.

FIG. 17 shows an example of 2 codes generated using this dual keys coding method. We can now reconsider the same situation as shown previously in FIG. 15 using this dual keys coding method. As shown in FIG. 18, the total code length of code 9201(K1+K2) is the same as code 9101 but consists of dual keys; likewise the total code length of code 9202(K3+K4) is the same as code 9102 but with dual keys. Code 9202 is transmitted first and moment later code 9201 is transmitted. As shown in diagram 906, although the time difference between the two transmissions incidentally equals to one code length of code 9201, the individual identity of the two codes with dual keys remains unique. The error as presented in diagram 903 can be eliminated.

To assure a fast response time of this coding method, a start bit or an end bit in a code is made up of not just a single pulse, but a minimum of 3 pulses. Its code length is kept below 1 m sec. and conforms to Set Theory. FIG. 18 shows an example of a complete code pattern of this anti-clash dual key game code.

Figure 8:
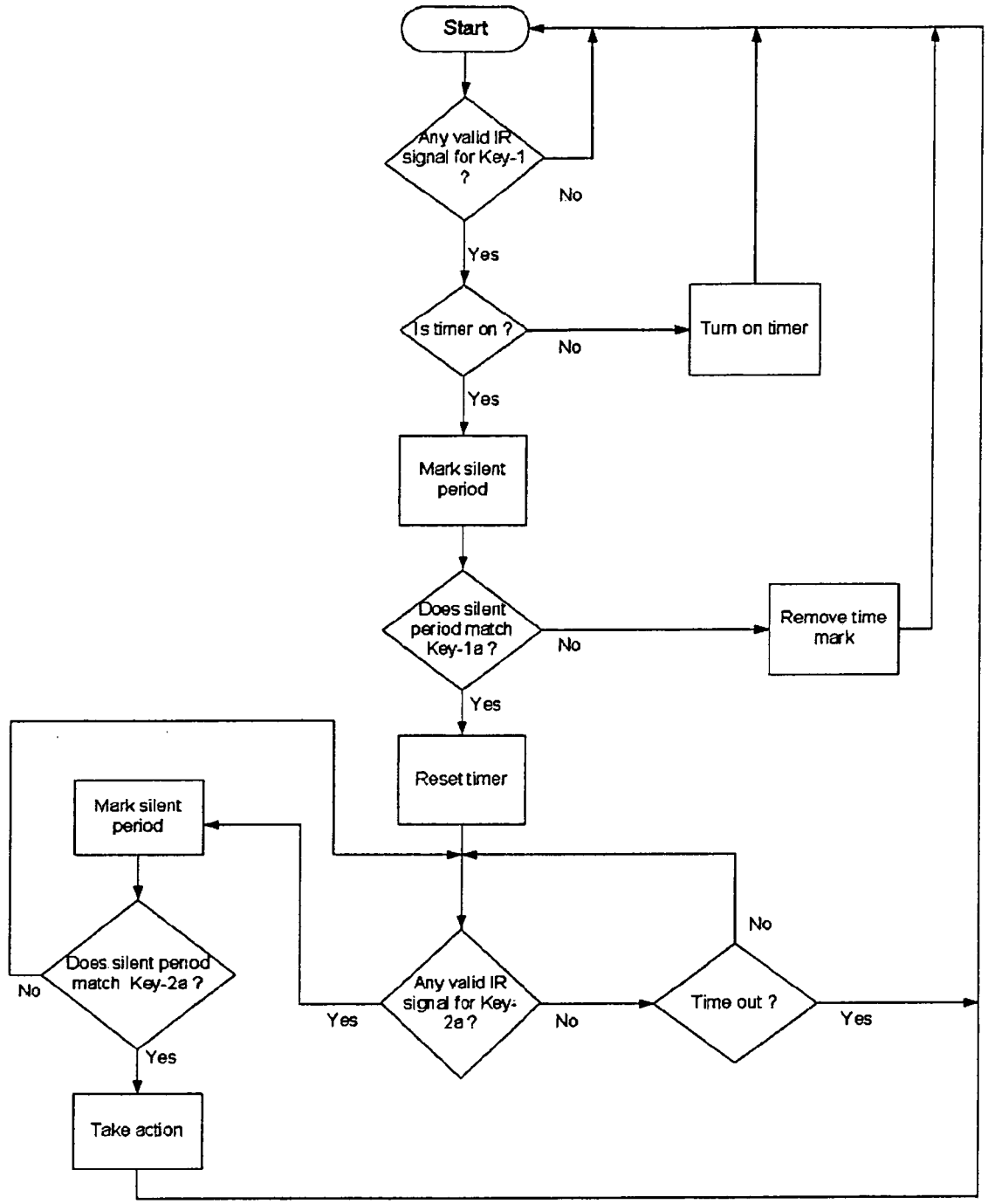
FIG. 8 shows a flowchart detailing a decoding method for resolving near simultaneous transmission.

Referring now to FIG. 8 we can see the flowchart for decoding a dual silent key code.

As explained previously, this invention employs a dual transmission method that includes the first transmission of an anti-clash game code for the interactive, multi-players game play, then followed by a second transmission of an operation code to operate a DVD machine. The format of the operation codes is in accordance to the specifications of the DVD machine manufacturers.

With regard to the data console 4, interconnectivity with the DVD player may be in many forms. In this preferred form, the following may be used. The audio and video outputs from a DVD machine are connected to the corresponding RCA inputs of the console and from the console's RCA outputs to a TV using interconnect cables. A Manchester code modulated 19 KHz audio signal is mixed with the other audio signals and recorded onto the game media file disc. When a game media file disc is played through a DVD machine, the audio signal from the DVD may be output to the console from the DVD machine. This audio signal is feed into pin no. 4 of U-1 through a coupling capacitor. U-1 is a tone decoder. The tone decoder band pass frequency in this circuit is set to 19 KHz to demodulate the 19 KHz audio signal. The demodulated Manchester code is then feed from the output, pin no. 8 of U-1, to the input, pin no. 20 of U-2. U-2 is a micro controller. The main function of U-2 in this circuit is to act as a code converter. When U2 receives a Manchester code from U-1, U-2 generates a PWM (pulse width modulated) equivalent code and sends this PWM code to its output pin no. 51. This PWM code is sent to three transistors Q1, Q2, and Q3 through biasing resistors R1, R2 and R3 respectively to drive 3 infrared emitting diodes DX1, DX2 and DX3 to transmit the PWM code to the remote control units 1 and 2.

The Manchester code used in this invention consists of 8 bits for the coding of the following basic game information:
1) Game buttons A, B, C and D.
2) 26 alphabets from A to Z.
3) Numbers from 0 to 99.

FIG. 19 shows the 8 bits Manchester codes for game buttons A, B, C and D respectively.

FIG. 20 shows the PWM codes equivalent for the game buttons Manchester codes shown in FIG. 19.

Figure 24:
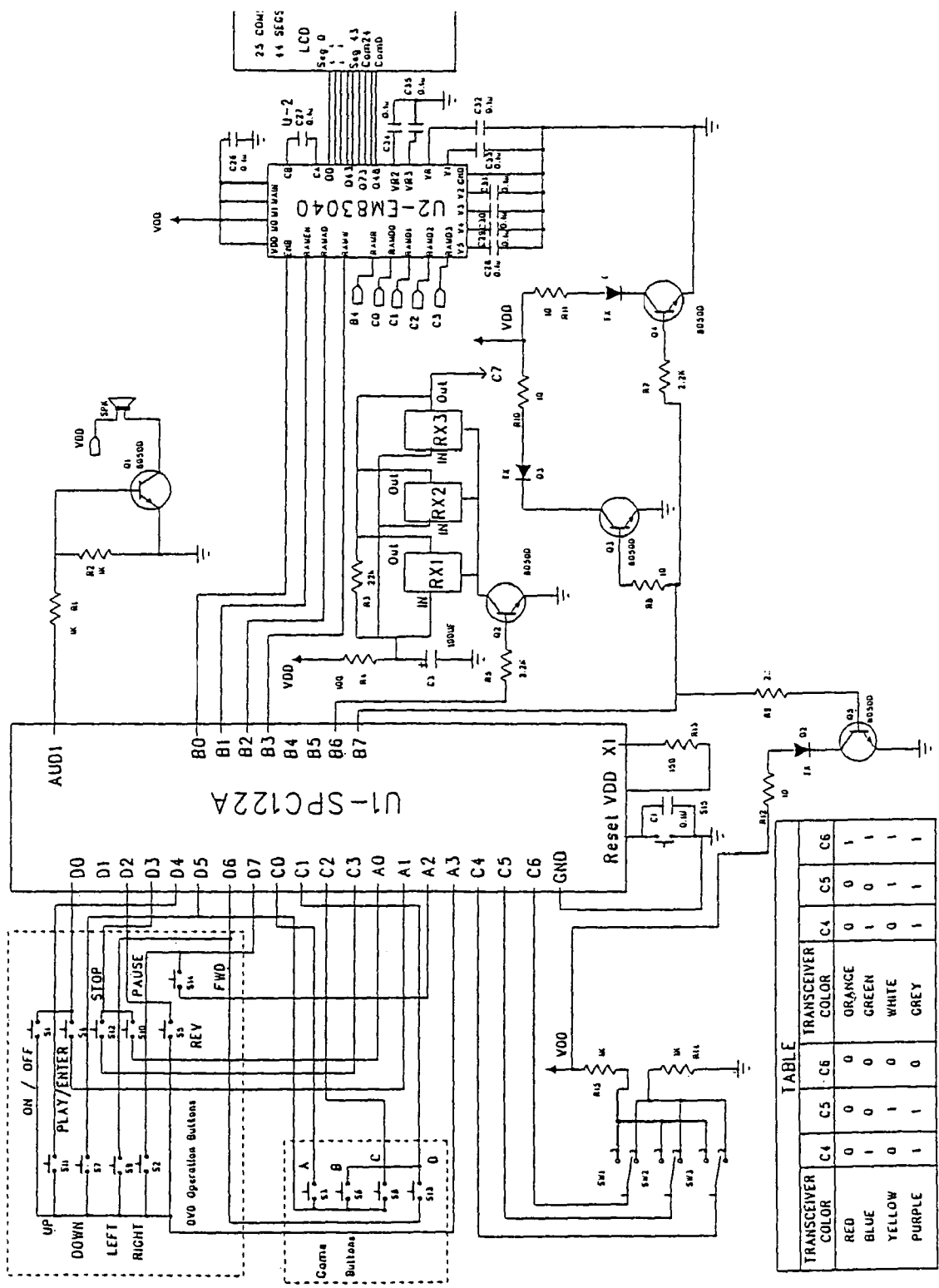
FIG. 24 is a circuit diagram for a transceiver in accordance with a preferred embodiment of the invention.
Figure 25:
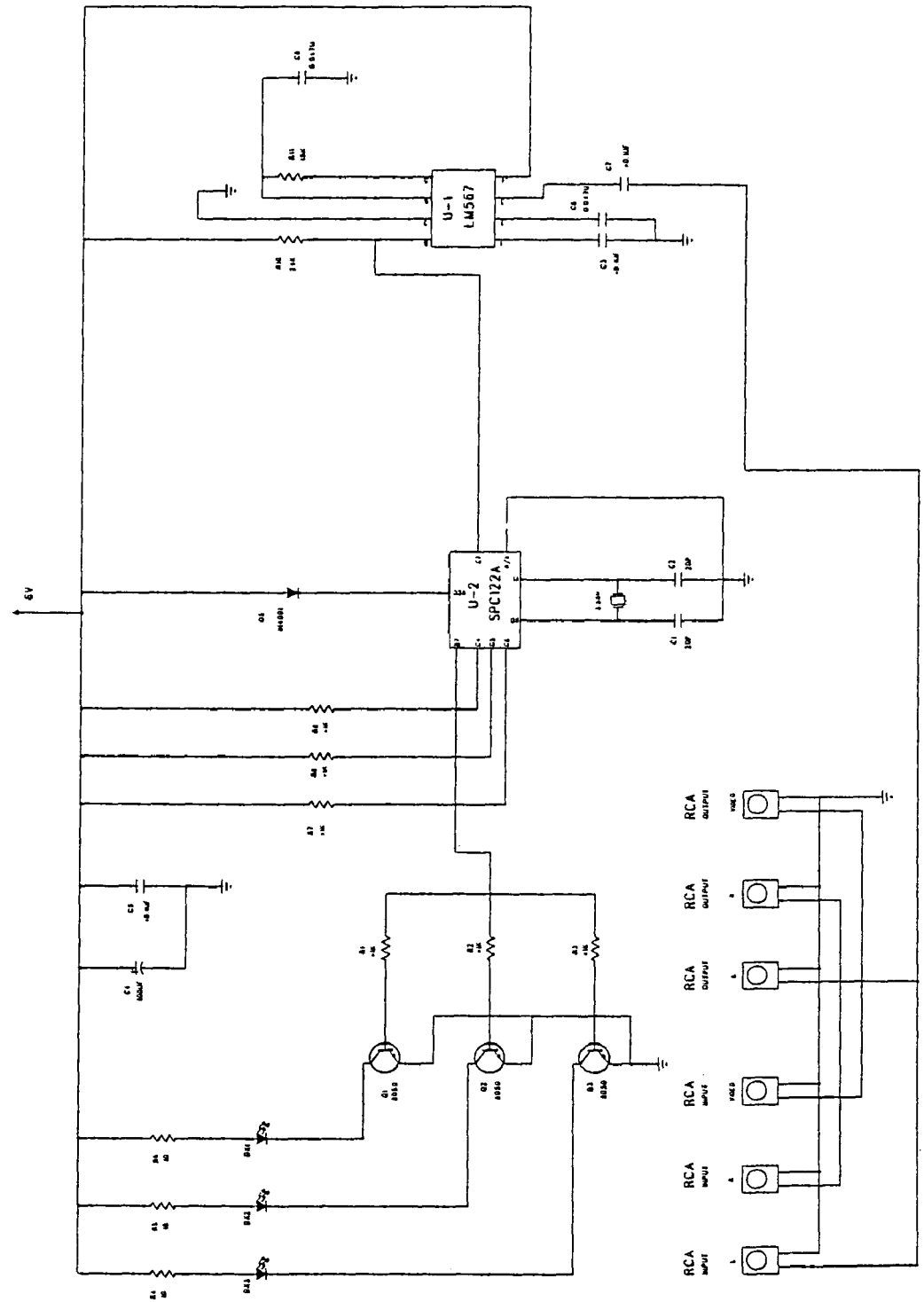
FIG. 25 is a circuit diagram for a data console in accordance with a preferred embodiment of the invention.

The remote control units in this preferred form of the invention may be provided as shown in FIG. 24. U-1 may be a micro-controller. There are two groups of buttons connected to U-1. One group consisting of 10 buttons are called DVD buttons. They are used for the remote control of a DVD machine. The other group consisted of 4 buttons marked with A, B, C, and D respectively and are called the game buttons. They are used to interact with a game, such as to make a selection from a menu or to log in an input to the DVD machine. As described previously in the text of this invention, a plurality of transceivers can be used simultaneously in this game without any interference. Also as explained, the transceivers employ a dual transmission method, which includes a first transmission of an anti-clash protocol called game code followed by a second transmission of a different protocol called operation code to communicate with and to operate a video machine. The anti-clash protocol in the first transmission is unique to each color-coded transceiver or remote 1, 2. Instead of having a separate coding IC for each transceiver, all the codes are stored in the memory of U-1, and can be programmed in the circuit using 3 I/O ports C4, C5 and C6 to accommodate 8 transceivers. By connecting the I/O lines to either ground (0) or VDD (1), it can program each transceiver with a unique anti-clash code in their first transmission.

When a button is activated, a code signal corresponding to the button being activated is sent from the memory to output port B7, pin 51 of U-1. This code signal then drives the three infrared light emitting diodes D2, D3, D4 through biasing resistors R7, R8, R9 and transistors Q3, Q4, Q5 respectively. Resistors R10, R11 and R12 are for current limiting to avoid overloading the infrared light emitting diodes D2, D3 and D4. The transceiver circuit employs three infrared light emitting diodes to ensure a wider transmission coverage of its code signals for a reliable communication with other transceivers and the DVD machine in the system. When a button is activated, a beeping tone signal is sent to output port AUD1, pin 33 of U-1 to provide an audio feedback to the player. This beeping signal is amplified by transistor Q1 through biasing resistors R1 and R2 to drive a loudspeaker. Rx1, Rx2 and Rx3 are commercially available infrared receiver modules. They are connected in parallel to ensure a wide reception angles.

When the data console transmits the game data to the transceivers, these infrared receiver modules receive this signal. This game data is then feed into U-1 through port C7, pin no. 20 and store in its memory. When a player responses to a quiz by pressing the game key of his choice, U-1 sends a corresponding code signal to drive the infrared light emitting diodes to send an anti-clash dual-transmission infra red signal to the other transceivers and the DVD machine in the system. Then U-1 compares the game key being activated to the game data that it has received and stored in its memory. If the key activated is the same key as contained in the game data, U-1 outputs the control signals and the data for the scores to U-2. U-2 is an LCD driver. This score data is then display on the dot matrix LCD display on a transceiver.

The remote control of this preferred form of the invention uses specialized buttons for control of the games in conjunction with a specifically programmed DVD. The interactivity and control of the DVD using the basic operations of a DVD player will now be described although it should be noted that this is a preferred embodiment only.

Unlike a typical remote control originally supplied with a DVD player, a the remote control of this invention has 4 specific game play buttons, marked with A, B, C and D respectively for single button direct interactive operation with the DVD games. Considering the menu operations available in a normal DVD movie, to make a choice from the menu, in most cases a user uses the up arrow key and/or the down arrow key on the remote to browse through the options and then press the enter/play key to login and operate the DVD player. To make a selection from a menu using a remote of the present invention, a user just presses the game button corresponding to his choice to make a selection.

In general, when a normal DVD is loaded into a DVD player, the DVD player begins to play automatically to show the start up video. It then shows a menu with options for the viewer to choose from. The viewer can use the remote control for the DVD player to browse through the options using the up/down arrow keys and/or the left/right arrow keys on his remote. The selected option is usually highlighted on the TV screen. As the viewer browses through the menu, the highlight of an option on the menu acts like a pointer for the DVD player to locate the entry point for that option. So when the viewer presses the enter/play key on his remote to confirm his choice, the DVD player begins to play from that entry point for a particular option.

Consider a simplified data structure of a typical DVD movie that consists of 6 individual video files. Generally, the video files are arranged in a sequential order from location 1 to location 6 and stored into a track or tracks in a DVD. Each video file is identified by an address. The DVD player locates the 1$^{st}$ location and displays the video file in this location. To go to the next location, the DVD player reads the address of the current video file and increases the address counter by 1 to get the next location to go to and display the next video file and so on until the end of the movie. In reality the data structure of a DVD and its operation are more complex although this is the basic operation that a DVD player may go through. A more detail explanation of the DVD data structure is available in the public domain.

To provide an interactive game, more sophisticated operations are required to allow the DVD to move in a non-sequential manner through the video files to bring up desired screens in response to particular operations of the remote control.

Figure 21:
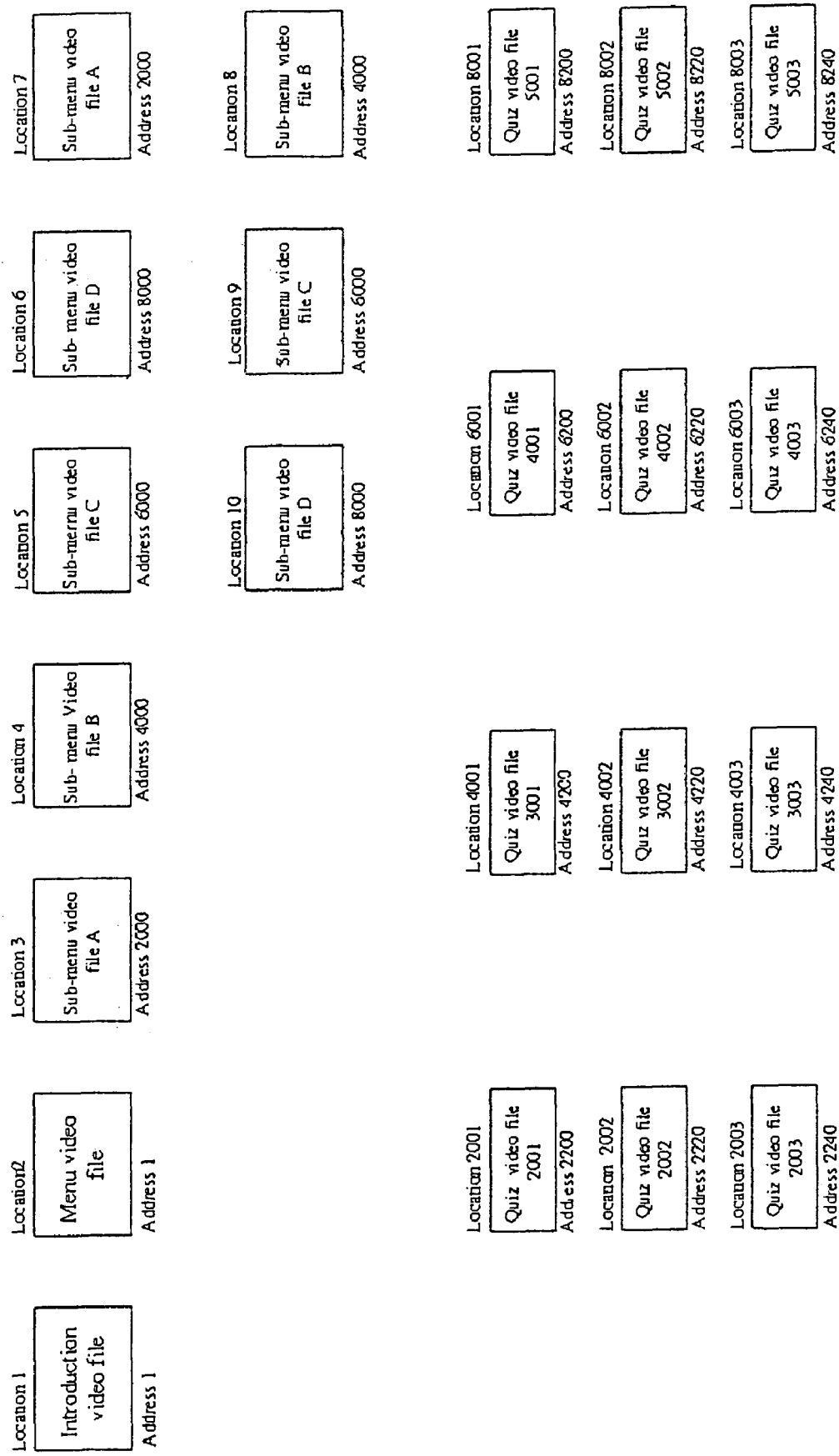
FIGS. 21 and 22 show the data structure for a preferred embodiment of a quiz game as contained on a DVD or media file for use as part of the invention.

FIG. 21 shows a simplified data structure of a DVD game as may be used in a quiz game or similar. As shown in FIG. 21, the address of the individual video files are not arranged sequentially as in a typical DVD movie. When a DVD game of the present invention is played, the DVD player displays the introduction video file. To move to the next video file location, the DVD player reads the address of the introduction video file and increases the address counter by 1 to get the address for the next location. Referring to FIG. 21, the address for the video file at location 1 is 1 so by increasing the address counter by 1, the next location is 2. The DVD player goes to location 2 to read and display the menu.

To allow the players to make a selection from the menu, the address for the menu video file is reassigned and made to be 1 during the programming of the video files into DVD data. Physically the menu video file is still located at location 2. At the end of the menu video file, the DVD player reads the address and increases the address counter by 1 to get the next location to go to. In this instance, the next location is 2 again because the address of the menu video file is 1. When the DVD player adds 1 to the address counter, the new address becomes 2. Therefore the DVD player replays the menu video file at location 2 and waits for an infrared signal from a remote control. In this particular embodiment, the menu video file at location 2 may display the options for the type of question to be asked such as general knowledge, sport, etc.

Each of the 4 game buttons on the remote is assigned with a code to modify a DVD player's address counter and hence to direct the DVD player to go to a specific location on a compatible DVD. The table below shows the impose address offset of the game buttons of 2 such remotes respectively:

TABLE

Remote address offsets

| Game button | Impose address offset |
|---|---|
| Remote no. 1 | |
| A(1) | +1 |
| B(1) | +2 |
| C(1) | +3 |
| D(1) | +4 |
| Remote no. 2 | |
| A(2) | +5 |
| B(2) | +6 |
| C(2) | +7 |
| D(2) | +8 |

If we refer to FIG. 21 again and assume player no. 1 holding remote no. 1 presses game button B to login his choice from the menu, remote no. 1 sends a dual transmission IR signal to instruct the DVD player to go to the next location by imposing an offset of +2 to the address counter in the DVD player. Upon receipt of the IR signal, the DVD player reads the address of the menu video file and increases the address counter by 1 and imposes the offset of +2 to the address counter, so the new address for the next video file location is 4.

| | |
|---|---|
| Current address for menu video file | 1 |
| Increase address counter by 1: | +1 |
| New address in address counter | 2 |
| Impose offset to address counter +2: | +2 |
| Therefore address for next location | 4 |

Hence, the IR signal for button B of remote no. 1 directs the DVD player to go to location 4. The video file at location 4 may be a still picture of the menu or a sub-menu or, in fact, this can just be a blank picture. The main purpose of this file is to hold the address to direct the DVD player to display a quiz based on a player's choice from the menu. The DVD player displays the menu still picture at location 4 and then reads the address to define the next location to go to.

| | |
|---|---|
| Current address for sub-menu | 2000 |
| Increase address counter by 1: | +1 |
| Address for next location | 2001 |

The DVD player then goes to location 2001 and displays a quiz of a players choice.

Similarly, other players can access the menu to make a choice by means of the respective game buttons on their Quiz Machine remote controls. Whether it is player 1 to make a choice of B or player 2 to make the choice of B from the same menu; the DVD player should be able to display the same type of quizzes for the game as decided by the players.

Now consider instead of player 1 selecting a choice of B from the menu using remote control no. 1 as descript previously, a second player presses button B to select a choice using remote control no. 2. That remote controller sends a dual transmission to instruct the DVD player to go to the next location by imposing an offset of +6 to the address counter.

| | |
|---|---|
| Current address for menu video file | 1 |
| Increase address counter by 1: | +1 |
| New address in address counter | 2 |
| Impose offset to address counter +6: | +6 |
| Therefore address for next location | 8 |

So the IR signal for button B of remote no. 2 directs the DVD player to go to location 8. The video file at location 8 is again a still picture of the menu. The DVD player goes to location 8, displays the menu still picture and reads the address to decide the next location to go to.

| | |
|---|---|
| Current address for menu still picture | 2000 |
| Increase address counter by 1: | +1 |
| Address for next location | 2001 |

The DVD player then goes to location 2001 and displays a quiz of a player's choice.

The above has shown that to make a choice from the quiz menu, a player just presses the game button of his choice. Also the game button B on remote control 1 and the game button B on remote control 2 would both be able to direct the DVD player to display a quiz in the same category. The address of the original locations 4 and 8 determined by buttons B on each remote are reassigned to be location 2000 and thereby allowing incremental passage through the address locations to arrive at the same location, address 2001, from different starting locations.

Figure 22:
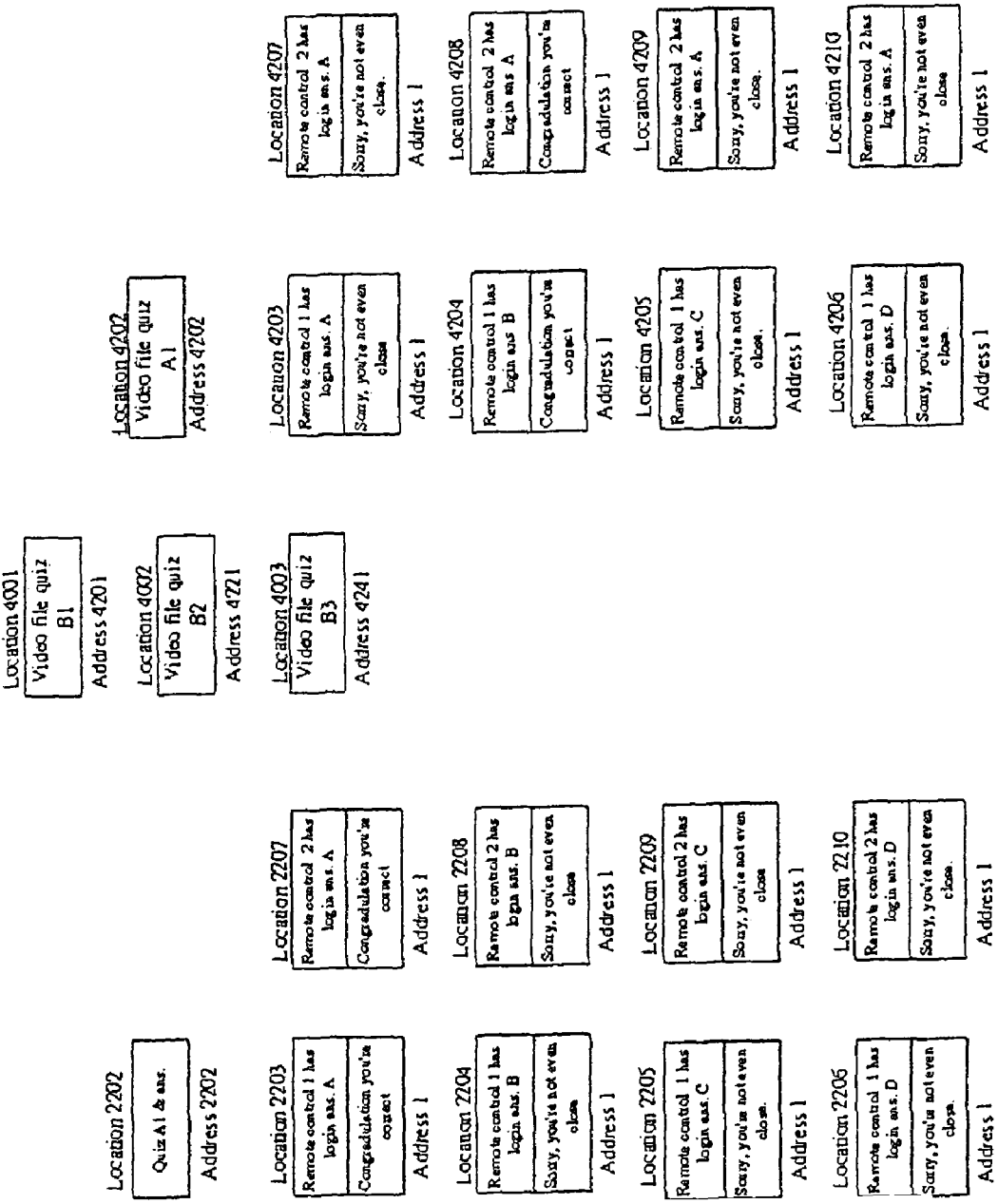

After a player has selected a choice for a quiz category from the menu, the DVD player goes to the quiz location for that category and randomly displays a question. Referring to FIG. 22, the first video file in this embodiment is a video from which a question will be asked. Then the DVD player displays the question and the options for the answer and waits for the players to enter their answer. Assume player no. 2 answers D for the question by pressing game button D on remote no. 2, the remote controller sends out a dual transmission IR to the DVD player. Upon receipt of the IR signal, the DVD player looks for the new location to go to,

| | |
|---|---|
| Current address for a quiz video file | 2201 |
| Increase address counter by 1: | +1 |
| New address in address counter | 2202 |
| Impose offset to address counter +8: | +8 |
| Therefore address for next location | 2210 |

The DVD player goes to location 2210 to display player that first responded and the answer selected and then to show whether the answer is correct or not. The address of the current location may then be reassigned to return DVD to the menus previously utilized by, for example, returning to the screens allowing a player to designate the category of the next question. This is done by redefining the current address as follows:

| | |
|---|---|
| Current address for picture file | 1 |
| Increase address counter by 1: | +1 |
| New address in address counter | 2 |

Hence, the DVD player goes to location 2 and displays the main menu again. By employing an imposed address offset coding method for the game buttons on a remote control and programming the addresses for the video files in accordance with the flow of a quiz game, it is possible to convert a DVD player into an interactive game platform.

It will be appreciated that any number of different interactive games may be designed in a similar manner. The DVD's use programmed addresses to determine the flow of the movement and can return to menu files as desired to allow a player to choose particular selections and control the game itself.

A game may comprise a quiz or similar which generates the questions in a random manner. This may be done still utilizing a conventional DVD player. In keeping with the other embodiments described, the generation of a random quiz may use technology within the remote controls or a console 4 used in conjunction with the apparatus, so as to limit any need to modify the DVD player itself.

In providing a game in which the questions are chosen from a random selection, this may be done by generating the random selection either in the remote or in the DVD player. If performed in the remote control, it may be transmitted in the form of a random address offset to direct the DVD player to the appropriate address in the DVD. If done in the DVD player, this may require transmission back to the remote control, particularly if it is desired to ensure that the random selection is not picked again within a predetermined period. This matter of excluding selections from being selected until the game is complete may be important for interactive games such as Bingo, various card games, or even if the number of questions in a quiz is small and hence it is desirable to inhibit early repetition of a question.

An example of an alternative method to generate a random address from the DVD player can be achieved by providing a menu that involves a number of selections relating to each of the possible desired options. For example, in a game where numbers are to be drawn randomly, the selections may relate to each of the numbers. A DVD player may be capable of allowing a player to scroll through menu selections. If this is done very fast through a number of selections and looped so that the sequence runs from say 1 to 99 and then back to 1 and through to 99 again, the actual number chosen once a player depressed a button to make a selection can be determined by the length of time the user depresses the button. The menu screen can show a suitable video file such as numbers tumbling in a container until the user of a remote lifts their finger from whichever button they are using to scroll through the menu selections. The randomness of the number is somewhat dependent on the scroll function being fast enough to inhibit the user from being able to predetermine the number though guessing the correct amount of time to hold the button depressed. Regardless, this is achievable and allows a random address location to be chosen by the DVD player itself. This is preferably transmitted back to the remote control through an output from the data console as is discussed earlier for some interactive functions.

Figure 23:
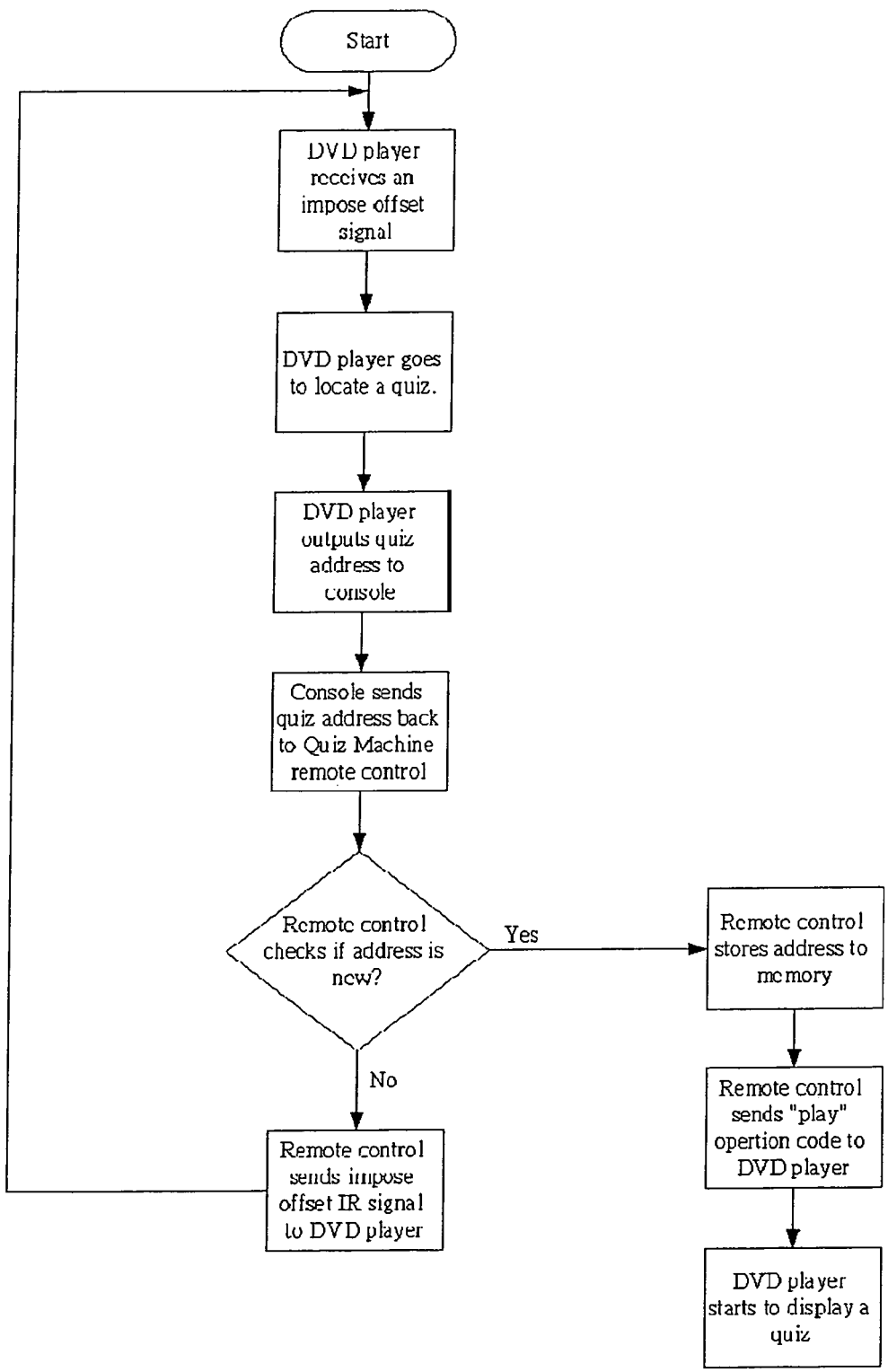
FIG. 23 is a flow chart of operations between a DVD player, data console and remote control in accordance with a yet further embodiment of the invention.

To exclude that particular selection from being chosen again, it is preferred to use the remote to keep track of the selections made previously. The reason for this is that there is little usable memory in a normal DVD player for holding such data. A flow diagram describing this operation is shown in FIG. 23. In this diagram it can be seen that the selection is transmitted back to the remote and if this is not a new selection for the period of time desired, the remote send the signal again to request a new selection.

Thus it can be seen that the invention provides a game for use on a conventional DVD machine or similar video machine, especially a digitally based version. When used in conjunction with a multiple specialized remote controls, the system and apparatus allows interactive control of the game through the normal infrared receiver on the DVD and also accommodates resolution of near simultaneous transmissions from the remotes by cancelling subsequent transmissions once a first operating remote has been determined.

In a yet further preferred form a console for interactivity with the controllers is provided and activated through coded transmissions from an output of the DVD machine.

The DVD's used in conjunction with the games may be specifically programmed for interactivity with the DVD's reassigning address locations to manipulate the sequential nature of address sourcing of a DVD player into a more dynamic movement through out the data or media file.

The invention claimed is:

1. A game apparatus for use with a media file reading and display apparatus operable by infrared wireless signals through a wireless signal receiver, said game apparatus comprising:
   at least two wireless signal transceiver units for producing infrared wireless signals in response to user inputs entered into the wireless signal transceiver units via single-step actuation, said infrared wireless signals each including an operational code and an associated comparison code uniquely identifying the wireless signal transceiver unit which produced it, wherein the infrared wireless signals are not indicative of signals ordinarily used to control operation of the media file reading and display apparatus;
   means for resolving which of the at least two wireless signal transceiver units is the first to transmit, said means for resolving being disposed in each of the wireless signal transceiver units and each being adapted for initially receiving the comparison codes of the transmitted infrared wireless signals without receiving the associated operational codes, each of the comparison codes including encoded first and second silent periods, wherein time durations of the encoded first and second silent periods are predetermined by reference to a set theory algorithm such that upon near simultaneous transmission of the comparison codes, identities of the transmitted comparison codes are able to be correctly decoded to resolve the first wireless transceiver unit to transmit; and
   means for automatically transmitting only the operational code associated with the comparison code produced by the first wireless signal transceiver unit to transmit, wherein the media file reading and display apparatus is able to receive the operational code directly from the first unit and process the operational code so as to enable a direct selection and display of a media file via imposed offset addressing wherein the direct selection and display of the media file is indicative of a game option being made during game play without a further user input being required.

2. The game apparatus as claimed in claim 1, wherein the wireless transmitter units include remote controls for a digital video machine.

3. The game apparatus as claimed in claim 2, further comprising
   a media containing apparatus containing a media file having programming instructions to control movement of a media file reader through the media file upon receipt of instructions from a controller;
   said media file directing and programming the media file reader to alternative memory locations in the media file to display screen images to construct interactive game and controlling responses of the media file reader to signals from the controller; and
   the programming instructions are effected by reference to the operational code of the infrared wireless signal transmitted from the first unit.

4. The game apparatus as claimed in claim 2, further comprising
   a programmed digital video disc for use with interactive games on a DVD player, said video disc includes
   a plurality of video files at specified locations; and
   the video files also containing instructions to alter an address location memorized in the DVD player such that a sequential determination of a subsequent address location that the DVD player moves to is other than a subsequent physical address location on the disc;
   said instructions are effected by reference to the operation code of the infrared wireless signal transmitted from the first unit.

5. The game apparatus as claimed in claim 1, wherein the means for resolving halt any further transmission by units other than the first unit producing a first transmission.

6. The game apparatus as claimed in claim 5, further comprising
   a media containing apparatus containing a media file having programming instructions to control movement of a media file reader through the media file upon receipt of instructions from a controller;
   said media file directing and programming the media file reader to alternative memory locations in the media file to display screen images to construct interactive game and controlling responses of the media file reader to signals from the controller; and the programming instructions are effected by reference to the operational code of the infrared wireless signal transmitted from the first unit.

7. The game apparatus as claimed in claim 5, further comprising a programmed digital video disc for use with interactive games on a DVD player, said video disc includes a plurality of video files at specified locations; and the video files also containing instructions to alter an address location memorized in the DVD player such that a sequential determination of a subsequent address location that the DVD player moves to is other than a subsequent physical address location on the disc;

said instructions are effected by reference to the operation code of the infrared wireless signal transmitted from the first unit.

8. The game apparatus as claimed in claim 1, further comprising a media containing apparatus containing a media file having programming instructions to control movement of a media file reader through the media file upon receipt of instructions from a controller;

said media file directing and programming the media file reader to alternative memory locations in the media file to display screen images to construct interactive game and controlling response of the media file reader to signals from the controller; and the programming instructions are affected by reference to the operational code of the infrared wireless signal transmitted from the first unit.

9. The game apparatus as claimed in claim 1, further comprising a programmed digital video disc for use with interactive games on a DVD player, said video disc includes a plurality of video files at specified locations; and the video files also containing instructions to alter an address location memorized in the DVD player such that a sequential determination of a subsequent address location that the DVD player moves to is other than a subsequent physical address location on the disc;

said instructions are effected by reference to the operational code of the infrared wireless signal transmitted from the first unit.

10. The game apparatus as claimed in claim 1, further comprising an interactive game system for use with a DVD player, said game system includes a disc containing a plurality of video files and address instructions to alter and address location the DVD player holds in memory so as to alter a next sequential address location to which the DVD player would normally address;

at least one remote control having a plurality of outputs to further alter the address location which the DVD player subsequently plays; and said at least one remote control includes the first unit.

11. A method of providing interactive multiplayer game play or entertainment with remote controls being adapted to produce infrared wireless signals in response to user inputs entered into the remote controls via single-step actuation of the remote controls, each of the infrared wireless signals having a comparison code and an associated operational code, wherein the infrared wireless signals are not indicative of signals ordinarily used to control operation of the media file reading and display apparatus, the method comprising the steps of:

(i) initially transmitting the comparison codes of the infrared wireless signals produced by the remote controls without the associated operational codes;

(ii) each of the remote controls resolving which of the at least two wireless signal transceiver units is the first to transmit, including initially receiving the comparison codes, each of the comparison codes including encoded first and second silent periods having time durations predetermined by reference to a set theory algorithm wherein upon near simultaneous transmission of the comparison codes identities of the transmitted comparison codes are able to be correctly decoded to resolve the first wireless transceiver unit to transmit; and (iii) automatically transmitting only the operational code associated with the comparison code produced by the first wireless signal transceiver unit to transmit, wherein the media file reading and display apparatus is able to receive the operational code directly from the first unit and process the operational code so as to enable a direct selection and display of a media file via imposed offset addressing wherein the direct selection and display of the media file is indicative of a game option being made during game play without a further user input being required.

* * * * *